(12) United States Patent
Mucke et al.

(10) Patent No.: US 6,268,778 B1
(45) Date of Patent: Jul. 31, 2001

(54) METHOD AND APPARATUS FOR FULLY INTEGRATING A VOLTAGE CONTROLLED OSCILLATOR ON AN INTEGRATED CIRCUIT

(75) Inventors: Lars Henrik Mucke; Christopher Dennis Hull, both of San Diego, CA (US); Lars Gustaf Jansson, Long Island, ME (US)

(73) Assignee: Silicon Wave, Inc., San Diego, CA (US)

( * ) Notice: Subject to any disclaimer, the term of this patent is extended or adjusted under 35 U.S.C. 154(b) by 0 days.

(21) Appl. No.: 09/304,136

(22) Filed: May 3, 1999

(51) Int. Cl.[7] ............................. H03B 5/12; H03L 7/099
(52) U.S. Cl. .................. 331/117 R; 331/34; 331/177 R; 331/177 V; 331/179
(58) Field of Search ................... 331/34, 117 R, 331/117 FE, 117 D, 177 R, 177 V, 179

(56) References Cited

U.S. PATENT DOCUMENTS

| | | | |
|---|---|---|---|
| 3,614,665 | 10/1971 | Weller et al. | 331/101 |
| 3,890,635 | 6/1975 | Engeler | 357/14 |
| 3,909,748 | 9/1975 | Yuan et al. | 331/117 |
| 3,978,431 | * 8/1976 | Lattin | 331/108 C |
| 5,254,958 | * 10/1993 | Flach et al. | 331/10 |
| 5,297,056 | 3/1994 | Lee et al. | 364/482 |
| 5,625,325 | 4/1997 | Rotzoll et al. | 331/16 |
| 5,739,730 | 4/1998 | Rotzoll | 331/177 |
| 5,745,012 | 4/1998 | Oka et al. | 331/68 |
| 5,764,112 | 6/1998 | Bal et al. | 331/116 |
| 5,821,818 | * 10/1998 | Idei et al. | 331/17 |
| 5,905,398 | 5/1999 | Todsen et al. | 327/337 |
| 5,914,513 | 6/1999 | Shenai et al. | 257/312 |
| 5,936,474 | * 8/1999 | Rousselin | 331/34 |

\* cited by examiner

*Primary Examiner*—David Mis
(74) *Attorney, Agent, or Firm*—Jaquez & Associates; Martin J. Jaquez

(57) ABSTRACT

A method and apparatus for fully integrating a Voltage Controlled Oscillator (VCO) on an integrated circuit. The VCO is implemented using a differential-mode circuit design. The differential-mode implementation of the VCO preferably comprises a differential mode LC-resonator circuit, a digital capacitor, a differential pair amplifier, and a current source. The LC-resonator circuit includes at least one tuning varactor and two high Q inductors. The tuning varactor preferably has a wide tuning capacitance range. The tuning varactor is only used to "fine-tune" the center output frequency $f_o$ of the VCO. The center output frequency $f_o$ is coarsely tuned by the digital capacitor. The VCO high Q inductors comprise high gain, high self-resonance, and low loss IC inductors. The IC VCO is fabricated on a high resistivity substrate material using a trench isolated guard ring. The guard ring isolates the fully integrated VCO, and each of its component parts, from RF signals that may be introduced into the IC substrate by other devices. By virtue of the improved performance characteristics provided by the digital capacitor, the analog tuning varactor, the high Q inductor, and the trench isolated guard ring techniques, the inventive VCO is fully integrated despite process variations in IC fabrication.

37 Claims, 9 Drawing Sheets

METHOD AND APPARATUS FOR FULLY INTEGRATING A VOLTAGE CONTROLLED OSCILLATOR ON AN INTEGRATED CIRCUIT

BACKGROUND OF THE INVENTION

1. Field of the Invention

This invention relates to integrated circuit devices, and more particularly to a method and apparatus for fully integrating a Voltage Controlled Oscillator (VCO) on an Integrated Circuit (IC) device.

2. Description of Related Art

One well-known problem to those skilled in the art of the design and manufacture of integrated circuits is the poor tolerance values associated with integrated circuit components, especially the tolerance values of passive circuit components. Due to process variations, device parameter spread, variations in critical parameters such as conductive layer sheet resistance values, film thickness, process uniformity and manufacturing equipment cleanliness, and other factors, integrated circuit passive electrical components often have tolerances that are approximately an order of magnitude worse than their analogous discrete external passive electrical components. Consequently, it has proven difficult and costly in the past to implement tuned networks or circuits using on-chip passive electrical components. One such tuned circuit is a voltage-controlled oscillator (VCO) in which a number of passive electrical devices are typically utilized to establish both the operating frequency and frequency offset of the VCO.

One well-known solution to this tolerance problem is to "trim" the integrated circuit until it operates within a set of pre-defined post-fabrication parameters. These "post-fabrication trimming" techniques are performed after manufacturing and testing the integrated circuit and are designed to physically alter the integrated circuit using a variety of methods including "Zener-zapping", laser trimming and fuse trimming. For example, using well-known fuse trimming techniques, fuseable links in an integrated circuit can be blown until the integrated circuit performs adequately under selected nominal conditions. Using these post-fabrication trimming techniques, passive electrical devices can be "fine-tuned" until they have acceptable tolerance values under nominal conditions. Disadvantageously, the trimming techniques produce only static solutions. For example, in fuse trimming, although the devices may perform adequately under nominal conditions, they may not perform adequately under all of the operating conditions of the integrated circuit. However, disadvantageously, the integrated circuit is permanently configured once the fuses are blown.

For example, as the voltage and temperature of the integrated circuit varies over time, offsets can be introduced despite the static settings created during the fuse trimming process. Devices that were once usable under the nominal conditions at which the fuses were blown may become unusable under some operating conditions, thus adversely affecting yield characteristics of the integrated circuits. In addition, the prior art post-fabrication solutions disadvantageously introduce additional manufacturing and testing steps into the manufacturing process. Using these prior art approaches, the manufacturer must first measure performance characteristics, trim the integrated circuits to conform to a selected set of performance and tolerance criteria, and test the results to ensure that the integrated circuit is trimmed appropriately. Thus, the prior art post-fabrication trimming techniques add additional time to the design and fabrication of integrated circuit devices and consequently add to the manufacturing costs of the integrated circuits.

In addition, as is well known in the electrical engineering arts, a voltage-controlled oscillator typically comprises a LC-resonator circuit coupled to an amplifier circuit and a current source. As is well known, the center output frequency $f_0$ is determined by the values of the inductor L and the total capacitance C of the LC-resonator circuit. More specifically, the center output frequency $f_0$ generated by the VCO is determined as follows: $f_0$ is approximately equal to: $1/(2\pi*SQRT(L*C_{tot}))$. The value of L is fixed. However, the value of $C_{tot}$ is variable and is determined by the capacitance of a tuning varactor that is typically controlled by a tuning voltage of $V_{tune}$. In practice, the VCO is tuned so that the center output frequency $f_0$ is nominally equal to a desired center frequency, for example, 2 GHz. Disadvantageously, when the VCO is implemented in an integrated circuit, poor tolerance values due to IC fabrication process variations and other factors can adversely affect the previously tuned center frequency. Consequently, the prior art VCO integrated circuit implementations disadvantageously require calibration to re-center the LC-resonator circuit's resonance frequency to a desired center frequency value. Due to variations from part to part, the prior art IC VCO implementations may be unreliable and totally unusable, especially when operating at high frequencies.

This limitation in the prior art IC VCO implementations also disadvantageously limits the frequency range over which the VCO can be tuned (the VCO tuning range). The tuning range of a VCO is determined by the sensitivity of the VCO (measured in Hz/Volt) and the range of the tuning voltage $V_{tune}$ that can be applied to the VCO (measured in Volts). For example, a VCO having a sensitivity of 50 MHz/Volt and a tuning voltage range of 2 volts theoretically has a tuning range of 100 MHz. However, due to process variations and other factors, the tuning ranges of the prior art IC VCO implementations are limited even further. Because the center output frequency $f_0$ varies from part to part as described above, the tuning range of the VCO may be narrowed by as much as 20–30%. Therefore a need exists for a fully integrated VCO that has a reliable and consistent center output frequency (consistent from part to part), is tunable over a wide range of frequencies, and is capable of being calibrated when the center output frequency varies due to process variations.

In addition to variations in desired center frequencies, the prior art IC VCO implementations disadvantageously are also very sensitive to low frequency noise that is introduced into the IC substrate. This sensitivity to noise characteristic not only further limits the prior art VCO tuning ranges, but it also severely limits the utility of the prior art VCO designs in some important applications, such as use in a mixed signal (analog and digital) integrated circuit environment. In general, VCOs are sensitive to noise because they have very high gains and therefore amplify whatever noise is present in the circuit. Most prior art IC VCO designs have been implemented using "junction-isolated" CMOS "bulk" processes wherein a diode-type junction exists between the epitaxial (EPI) silicon layer ("bulk" or "well" wherein specific IC devices are implemented) and the substrate of the device. The capacitance of the well-substrate junction often exhibits a voltage dependency and it is therefore non-linear.

This non-linear well-substrate junction capacitance is particularly problematic in IC VCO implementations. The non-linear well-substrate junction capacitance acts as an undesirable additional tuning port of the VCO. In addition to the desired VCO tuning varactor (controlled by the tuning voltage $V_{tune}$), the well-substrate junction functions as an additional tuning varactor. Disadvantageously, the well-substrate nonlinear capacitance FM-modulates the VCO center output frequency $f_0$ when low frequency noise is introduced into the substrate. The low frequency noise travels through the substrate and changes the capacitance of the well-substrate junction, which in turn modulates the center output frequency $f_0$ of the VCO (because the center output frequency is dependent upon the total capacitance of the LC-resonator circuit as described above). Furthermore, due to the well-substrate junction of prior art designs, the total parasitic capacitance is also increased. Increased parasitic capacitance disadvantageously also decreases the tuning range of the IC VCO implementations.

Consequently, due to the well-substrate junctions of the prior art IC VCO designs, the VCO center output frequencies have proven unreliable from part to part, and they also are not amenable for use in a mixed signal environment. Low frequency noise caused by digital circuitry located elsewhere on the integrated circuit disadvantageously is introduced into the substrate and propagates through the substrate to the VCO, whereat it FM-modulates the VCO center output frequency. A typical center output frequency of 2 GHz, for example, might be FM-modulated by a digital data signal having a frequency of 100 kHz. This renders these prior art IC VCO designs useless for some applications where the center output frequency must be tightly controlled such as in wireless communication systems.

The prior art IC VCO designs used tuning varactors comprising junction diodes. Disadvantageously, these junction diode tuning varactors also introduced parasitic capacitance into the VCO circuits. In addition, the traditional varactors were limited in that they could only change capacitance values by at most a factor of $1/\sqrt{2}$ per octave, which, in turn, caused the tuning range of the VCO to be limited to a factor of $1/\sqrt{2}$ per octave. The prior art tuning varactors therefore further limited the tuning range of the VCO. As described above, low-frequency noise introduced into the substrate can FM-modulate the capacitance of the prior art tuning varactor diodes, and further FM-modulate the center output frequency of the VCO. In addition, the prior art VCO designs disadvantageously create a forward bias conduction of current that is applied to the varactors due to the large swings experienced by the prior art VCO designs. Disadvantageously, the forward bias conduction of current reduces the effective Q of the tank circuit in the VCO. Therefore, a need exists for an improved fully integrated VCO having tuning varactors with increased tunable capacitance ranges, such as having the capability of changing by a factor of three or four to one. The need also exists for an improved IC VCO having tuning varactors that are electrically isolated from the IC substrate.

In addition to the tuning varactors, the prior art IC VCO designs use inductors that have a relatively low Q value and LC resonator circuits having relatively low self-resonance frequencies. Low Q values of the inductors produce increases in phase noise and frequency errors. In addition, for the reasons provided above, the inductors also add parasitic capacitance to the IC due to the existence of low-resistivity substrates used in the prior art implementations. Further, the local oscillation (LO) radiation produced by the prior art inductors disadvantageously radiate down into the IC substrate and thereby introduce undesirable noise energy into the substrate. Not only does this detrimentally affect the performance of the VCO (by further limiting the tuning range), the radiated noise energy detrimentally affects other circuits in the IC. This can be especially detrimental in a mixed signal IC.

For example, one contemplated application for a fully integrated VCO is use with a "down-conversion" or "direct down conversion" circuit that converts an incoming RF signal to a digital signal. The direct down conversion circuit includes a low-noise amplifier, the inputs of which are especially sensitive to the LO radiation generated by the prior art VCO inductors. The inductors in the prior art IC VCO designs consequently further limited the performance, utility, and tuning range of the prior art IC VCO implementations. Therefore, a need exists for a fully integrated VCO with improved IC inductors, wherein the inductors have reduced LO radiation characteristics, increased Q and self-resonance properties, and reduced parasitic capacitance.

A need exists for a method and apparatus for fully integrating a VCO that can overcome the disadvantages associated with the prior art IC VCO implementations and that will facilitate the integration of VCO designs on a single integrated circuit with other circuit devices. The need exists for an apparatus and method that facilitates the full integration of a calibrated tuned capacitor network such as a VCO.

A need exists for a method and apparatus for fully integrating a VCO in an IC wherein the fully integrated VCO has no electrical junction between the well and substrate (i.e., it has an improved isolation between the well and the substrate), and therefore has reduced parasitic capacitance values, and if any capacitance exits, the capacitance is linear. The need exists for a fully integrated VCO that is relatively insensitive to noise, has wide tuning range, and that uses inductors having high Q values and high self-resonance characteristics. The improved fully integrated VCO should be easily and inexpensively implemented, reliable, and reproducible despite poor tolerance values typically associated with process variations in integrated circuit fabrication.

The present invention provides such a method and apparatus for fully integrating a VCO in an integrated circuit.

SUMMARY OF THE INVENTION

The present invention is a novel method and apparatus for fully integrating a voltage-controlled oscillator (VCO) in an integrated circuit device. In one preferred embodiment, the VCO of the present invention is implemented using a differential-mode circuit design. The differential-mode implementation of the VCO preferably comprises a differential mode LC-resonator circuit, a calibrating multi-bit digital capacitor, a differential pair amplifier, and a current source. The LC-resonator circuit includes at least one analog tuning varactor and two high Q inductors having high self-resonance characteristics.

The multi-bit digital capacitor preferably is implemented with a bank of binary capacitors arranged in a parallel configuration. The binary capacitors can be weighted in a desired fashion. The multi-bit digital capacitor allows capacitance values within the fully integrated VCO to be customized to any desired and convenient value. Specifically, in the fully integrated VCO of the present invention, the multi-bit digital capacitor is used to digitally modify the capacitance of the LC tank circuit of the LC-resonator circuit. The LC tank circuit is tuned with respect to an applied D.C. control voltage. Re-centering the LC-resonator center frequency after IC fabrication compensates process variations introduced by integrated circuit fabrication processes. In accordance with the present invention, the center output frequency of the VCO is calibrated by digitally modifying the capacitance of the VCO's digitally controlled digital capacitor.

The analog tuning varactor preferably comprises an integrated circuit varactor structure having a wide tuning capacitance range. The IC varactor structure preferably includes either a P-gate/N-well or N-gate/P-well layer structure ideally formed on a Silicon On Insulator (SOI) substrate. The tuning varactor is preferably completely isolated from the IC substrate by an oxide layer of the SOI substrate and by oxide-filled trenches formed on both sides of the varactor structure. The trenches preferably extend to the oxide layer of the SOI substrate. Owing to the lack of a junction between the well and the substrate, the tuning varactor introduces reduced parasitic capacitance into the IC, and what capacitance is introduced is linear. Consequently, the analog tuning varactor reduces the sensitivity of the VCO to low frequency energy occurring in the IC substrate. The tuning varactor also provides an improved tuning capacitance range, which, in turn, increases the frequency tuning range of the fully integrated VCO. The tuning varactor preferably slowly changes from a lower capacitance value to a higher capacitance value.

The analog tuning varactor is preferably only used to "fine-tune" the center output frequency $f_0$ of the VCO. The center output frequency $f_0$ is preferably coarsely tuned by the digital control word and the digital capacitor. The desired output frequency band is selected by applying a desired digital control word to the digital capacitor. By using an analog control line ($V_{tune}$) to fine-tune the VCO center output frequency, and by using a digital control line to coarsely tune the VCO center output frequency, the noise sensitivity of the VCO is reduced and the VCO consequently has an improved frequency tuning range.

The VCO high Q inductors preferably comprise inductors having high Q values, high self-resonance, and low loss integrated circuit inductors that reduce the LO radiation introduced into the IC substrate. The IC inductors are preferably formed on an SOI substrate where the substrate of the SOI preferably has a high resistivity. The high Q inductor structure preferably includes a shielding pattern that induces a plurality of small eddy currents to shield the IC substrate from magnetic energy generated by the inductor. The inductor has a high quality factor and a high self-resonance frequency due to the effective shielding of electromagnetic energy from the IC substrate while not reducing the effective inductance of the inductor or introducing substantial parasitic capacitance. This, in turn, improves the overall performance of the fully integrated VCO, increases the VCO tuning range, makes the VCO more reliable and useful in a wider variety of applications such as in mixed signal environments, and aids in reducing the VCO noise sensitivity.

The inventive fully integrated VCO is preferably fabricated on a high resistivity substrate material using a trench isolated guard ring capable of providing radio frequency (RF) signal isolation. In accordance with the present invention, a first isolation trench is preferably formed in additional semiconductor layers that extend to an insulating layer. The first isolation trench preferably surrounds a first selected surface area of the additional semiconductor layers. A second isolation trench also is preferably formed in the additional semiconductor layers. The second isolation trench preferably surrounds the first isolation trench. The second isolation trench defines a guard ring region between itself and the first isolation trench. A ground conductor is preferably coupled to the guard ring region. The guard ring isolates the fully integrated VCO, and each of its component parts, from RF signals that may be introduced into the IC substrate.

By virtue of improved performance characteristics provided by the digital capacitor, the analog tuning varactor, the high Q inductor, and the trench isolated guard ring, the inventive VCO can be fully integrated despite poor tolerance values typically associated with process variations in integrated circuit fabrication. The present invention improves the performance of wireless communication devices without requiring the use of expensive and large discrete components. The present invention is particularly useful in broadband wireless digital communication systems such as CDMA cellular systems, however it can also find utility in other communication systems such as those made in accordance with the proposed Bluetooth standard.

The details of the preferred and alternative embodiments of the present invention are set forth in the accompanying drawings and the description below. Once the details of the invention are known, numerous additional innovations and changes will become obvious to one skilled in the art.

BRIEF DESCRIPTION OF THE DRAWINGS

FIG. 4b is a simplified schematic representation of the digital capacitor of FIG. 4a.

FIG. 5 is a plot showing how the capacitance of the digital capacitor of FIG. 4a varies depending upon the digital control word $CAL_{word}$ applied to the terminals of the plurality of binary capacitors shown in FIG. 4a.

FIG. 6 shows a differential mode implementation of the digital capacitor of FIG. 4a.

Like reference numbers and designations in the various drawings indicate like elements.

DETAILED DESCRIPTION OF THE INVENTION

Throughout this description, the preferred embodiment and examples shown should be considered as exemplars, rather than as limitations on the present invention.

Figure 1:
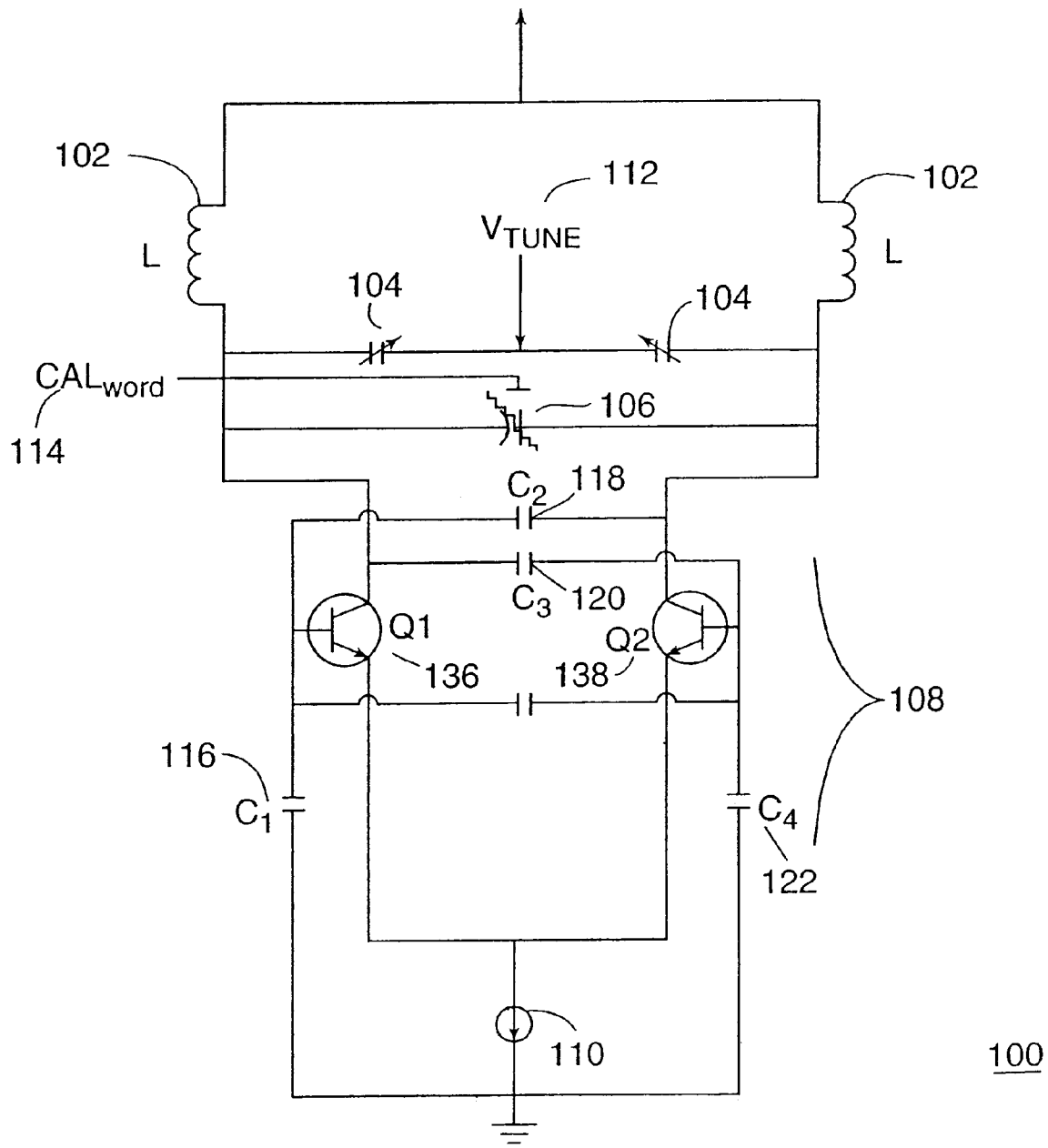
FIG. 1 is a simplified schematic of the fully integrated VCO of the present invention.

FIG. 1 shows a simplified schematic of the fully integrated VCO 100 made in accordance with the present invention. In the embodiment shown in FIG. 1, the fully integrated VCO is implemented using a differential-mode circuit design. However, those skilled in the integrated circuit design art will recognize that the alternative implementations can be used without departing from the scope and spirit of the present invention. As shown in FIG. 1, the preferred embodiment of the fully integrated VCO includes two high Q inductors L 102, at least one analog tuning varactor 104, a calibrating multi-bit digital capacitor 106, a differential pair amplifier 108, and a current source 110. The two high Q inductors 102 and the analog tuning varactors 104 form an LC-resonator circuit. The differential pair amplifier 108 preferably includes a pair of differential transistors $Q_1$ 136 and $Q_2$ 138 coupled as shown in FIG. 1 to a plurality of feedback capacitors, $C_1$ 116, $C_2$ 118, $C_3$ 120 and $C_4$ 122.

As described in more detailed below, the high Q inductors 102 and the analog tuning varactors 104 determine the resonance frequency of the LC-resonator circuit. The resonance frequency of the LC-resonator is determined by the values of L and $C_{total}$. More specifically, the resonance frequency is equal to $1/(2\pi*SQRT(L*C_{total}))$. The value of L remains fixed and is determined by the inductance of the high Q inductor 102. The total capacitance of the LC-resonator $C_{total}$ can be selectively varied and is determined by the capacitance of the analog tuning varactors 104 and the capacitance of the digital capacitor 106. Because the digital capacitor 106 and the analog tuning varactors 104 are connected in parallel, their capacitance values add together to yield a total capacitance $C_{total}$ of the LC-resonator. That is, $C_{total}=C_{CAL}+C_{tune}+(C_1*C_2/C_1+C_2)$. The capacitance of the analog tuning varactors, $C_{tune}$, is controlled by an analog tuning voltage $V_{tune}$ 112. In accordance with one preferred embodiment of the present invention, $V_{tune}$ 112 is used to fine-tune the center output frequency $f_0$ of the VCO 100. In contrast, the capacitance of the digital capacitor 106 is controlled by a digital control word, $CAL_{word}$ 114. In the preferred embodiment $CAL_{word}$ 114 is used to coarsely tune the center output frequency $f_0$ of the VCO 100.

The desired output frequency band is preferably selected by asserting a desired digital control word $CAL_{word}$ 114 and thereby changing the capacitance of the digital capacitor 106. That is, a frequency range for the VCO output frequency is established by setting the digital control word $CAL_{word}$ 114 to a selected value. Once the frequency band is selected, a more precise center output frequency $f_0$ can be established by appropriately adjusting the analog tuning voltage $V_{tune}$ 112 (the analog tuning voltage is preferably controlled by a Phase Locked Loop (PLL)). This fine-tuning/coarse-tuning scheme advantageously reduces the noise sensitivity and increases the tuning range of the inventive VCO 100. Prior art VCO IC implementations have used analog tuning signals (i.e., $V_{tune}$) to tune the VCO over their entire frequency range.

However, any noise present on the analog control line will FM-modulate the VCO output frequency.

In contrast, the present invention uses the analog control line to only fine-tune the VCO output frequency. As described below in more detail, the digital control word causes the digital capacitor to output a capacitance that is insensitive to small fluctuations in the voltage applied to the individual binary capacitors of the digital capacitor. Therefore, once the frequency band is coarsely established by the digital control word, the inventive VCO advantageously does not respond to noise present on the digital control word. Noise present on the analog control line will only affect the fine-tuned center frequency of the VCO. However, it will not significantly FM-modulate the VCO output frequency. Consequently, the present inventive fully integrated VCO 100 has a very wide frequency tuning range, and only modest sensitivity to noise on the analog control line.

As described in more detail below, the high Q inductors 102 preferably comprise inductors having high Q values, high self-resonance characteristics, and are low loss integrated circuit inductors. The inductors preferably introduce low radiation into the integrated circuit substrate. The inductors 102 are preferably formed on an SOI substrate where the substrate has a high resistivity. The inductors preferably reduce the Local Oscillation (LO) radiation introduced into the IC substrate. Details of the implementation of the preferred high Q inductors 102 are provided below in the inductor sub-section.

The analog tuning varactors 104 preferably comprise IC varactor structures having a wide capacitance tuning range. As described below in more detail, the IC varactor structures preferably include either a P-gate/N-well or N-gate/P-well layer structure preferably formed on an SOI substrate. In the preferred embodiment, the varactor is isolated from the IC substrate by an oxide layer of the substrate and by oxide-filled trenches formed on both sides of the varactor structure. The tuning varactors 104 introduce reduced parasitic capacitance into the IC because no junction exists between the varactor well and the substrate. In addition, whatever capacitance is introduced by the tuning varactors is linear, thereby reducing the noise sensitivity of the VCO 100. The improved tuning capacitance provided by the tuning varactors (improved range over which the capacitance can be varied) increases the frequency tuning range of the fully integrated VCO 100. The preferred tuning varactors 104 are described in more detail below in the varactor sub-section.

In addition, the fully integrated VCO 100 of FIG. 1 is preferably fabricated using a trench isolated guard ring technique. The preferred trench isolated guard ring technique provides isolation from noise and radio frequency (RF) signals. The trench guard ring isolation technique is described in more detail below.

Each of the essential inventive components of the present fully integrated VCO 100 of FIG. 1 is described below in corresponding sub-sections. The description of the digital capacitor 106 of FIG. 1 is provided first. This is followed by a detailed description of the preferred high Q inductors 102 and the varactors 104. The trench guard ring isolation technique preferably used to implement the fully integrated VCO 100 is described as it is used in implementing each component of the VCO. A description of a more detailed schematic of the preferred integrated VCO 100, and a description of a preferred integrated circuit layout of the VCO 100 of FIG. 1 follow these descriptions.

Digital Capacitor

Figure 2:
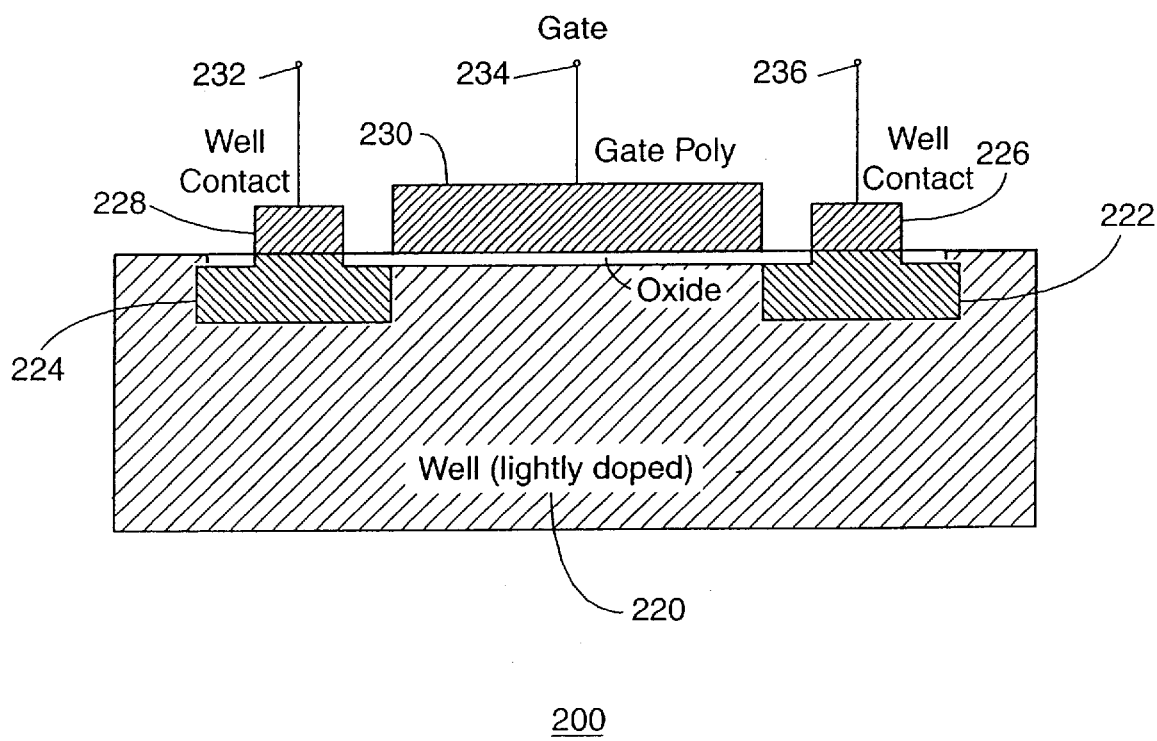
FIG. 2 shows a simplified cross-sectional view of a MOSFET structure configured for use as a "binary" capacitor for use in implementing the digital capacitor shown in FIG. 1.

FIG. 2 shows a simplified cross-sectional view of a MOSFET structure configured for use as a "binary" capacitor for use in implementing the digital capacitor 106 of FIG. 1.

As shown in FIG. 2, a binary capacitor 200 preferably comprises an N-well (or "bulk") 220, $N^+$ well contact implant regions 222, 224, metal well contacts 226, 228, and a polysilicon P-gate 230. Using well-known MOSFET fabrication techniques, the binary capacitor 200 is preferably formed by lightly doping the N-well implant layer 220 (for a p-channel MOSFET device) with appropriate n-type dopant materials. The $N^+$ well contact implant regions 222, 224 preferably comprise highly doped $N^+$ regions diffused into the N-well implant layer 220. The metal area of the P-gate 234, in conjunction with the insulating dielectric oxide layer and the semiconductor channel formed between the $N^+$ well contact implant regions 222, 224, create a parallel-plate capacitor. The capacitor is formed between the P-gate 234 and the electrically coupled metal well contacts 226 and 228. As described below in more detail with reference to FIG. 3, the capacitance between the P-gate 230 and the well 220 (the "gate-to-bulk" capacitance $C_{gate-bulk}$) of the binary capacitor 200 varies depending upon the D.C. bias voltage applied between the P-gate terminal 234 and the well contact implant terminals 232, 236.

Figure 3:
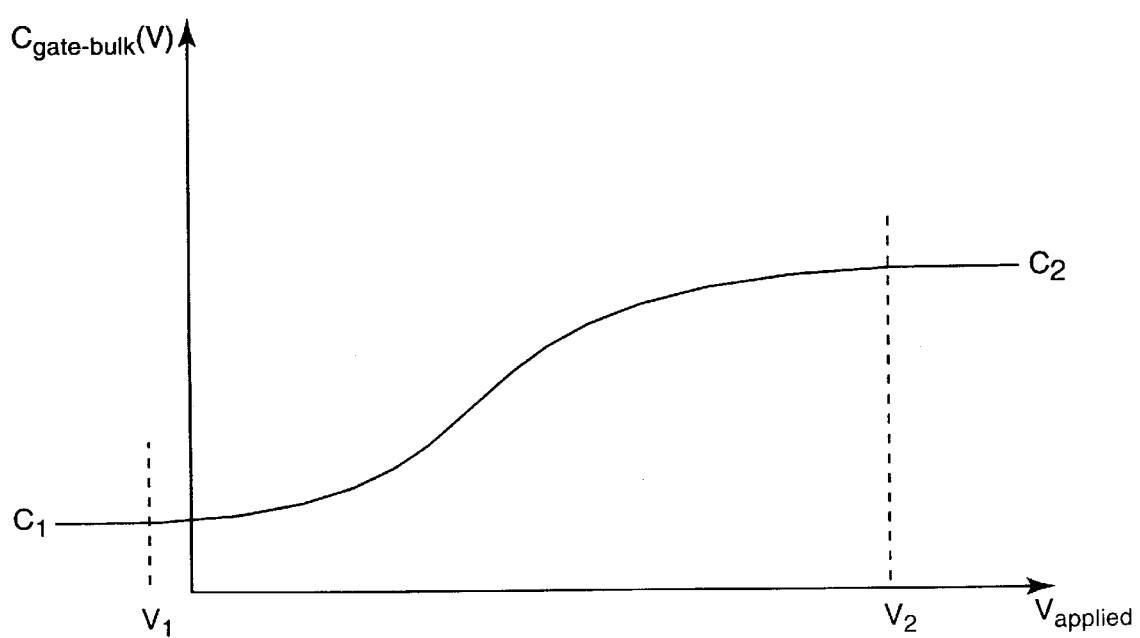
FIG. 3 is a capacitance-voltage (CV) plot showing the dependency of the gate-to-bulk capacitance $C_{gate-bulk}$ upon the D.C. bias voltage applied between the gate and the well of the binary capacitor shown in FIG. 2.

FIG. 3 shows the dependency of the gate-to-bulk capacitance $C_{gate-bulk}$ upon the D.C. bias voltage that is applied between the P-gate terminal 234 and the well contact implant terminals 232, 236 of the binary capacitor 200 of FIG. 2. As shown in the capacitance-voltage plot of FIG. 3, the gate-to-bulk capacitance $C_{gate-bulk}$ varies between a first capacitance value $C_{LOW}$ and a second capacitance value $C_{HIGH}$ as the applied D.C. bias voltage is varied between a first threshold voltage $V_1$ and a second voltage threshold $V_2$. In this embodiment of the binary capacitor 200 (i.e., a P-gate/N-well embodiment), $V_1$ and $V_2$ are applied to the P-gate terminal 234 with positive polarities with respect to the well contact terminals 232, 236. That is, $V_1$ and $V_2$ are applied as positive polarity voltages with respect to the $N^+$ well contact implant regions 222, 224. The binary capacitor 200 is said to be operating in an "accumulation" mode in this embodiment.

Referring again to FIG. 2, by applying a D.C. bias voltage $V_{applied}$ that is equal to or less than $V_1$, $C_{gate-bulk}(V)=C_{LOW}$. By applying a positive D.C. bias voltage $V_{applied}$ that is equal to or greater than $V_2$, $C_{gate-bulk}(V)=C_{HIGH}$. As the D.C. bias voltage varies between the threshold voltages $V_1$ and $V_2$, $C_{gate-bulk}(V)$ follows the slope as shown in FIG. 3 and varies between the first capacitance value $C_{LOW}$ and the second capacitance value $C_{HIGH}$ (i.e., the binary capacitor 200 behaves as a varactor in this relatively narrow voltage range). Thus, as shown, the binary capacitor 200 of FIG. 2 has a first lower capacitance $C_{LOW}$ (that is flat over a relatively wide voltage range less than or equal to $V_1$), a second higher capacitance $C_{HIGH}$ (that is flat over a relatively wide voltage range greater than or equal to $V_2$), and a variable capacitance (variable between $C_{LOW}$ and $C_{HIGH}$) in the relatively narrow range of voltages between $V_1$ and $V_2$.

In one preferred embodiment of the binary capacitor, the second capacitance value $C_{HIGH}$ is approximately two to three times greater than the first capacitance value $C_{LOW}$. That is, $C_{HIGH}/C_{LOW}$ is approximately equal to 2 or 3 in one preferred embodiment. Simply varying the device geometry and thereby making the physical size of the capacitor larger or smaller can vary the specific values of $C_{LOW}$ and $C_{HIGH}$ for any specific binary capacitor.

By varying the D.C. bias voltage applied across the terminals (e.g., the terminals 232, 234, 236) of the binary capacitor 200 of FIG. 2, the capacitance value is varied between $C_{LOW}$ and $C_{HIGH}$. If $V_1$ represents a Boolean logic value of "zero", and $V_2$ represents a logical "one", then the capacitance $C_{gate-bulk}(V)$ can be digitally controlled using one control bit to be equal to either $C_{LOW}$ (when a logical zero is applied) or $C_{HIGH}$ (when a logical one is applied). Thus, the device shown in FIG. 2 is referred to as a "binary" capacitor because the capacitance of the device 200 can be digitally controlled to be equal to one of two states. Specifically, the digital control signal controls the difference or differential between $C_{HIGH}$ and $C_{LOW}$ (referred to hereinafter as the "differential capacitance"). That is $C_{LSB}$ (the differential capacitance of the binary capacitor 200 as controlled by a least significant bit of a digital control word) is equal to $C_{HIGH}$ minus $C_{LOW}$.

Although one embodiment of the binary capacitor of the binary capacitor is shown in FIG. 2, other alternative embodiments are possible. As described above, the binary capacitor 200 may be implemented using a bulk CMOS process. Alternatively, the binary capacitor may be implemented as an integrated circuit varactor structure that includes a P-gate/N-well layer structure ideally formed on a Silicon-on-Insulator ("SOI") substrate. In this embodiment of the binary capacitor 200, the varactor structure is completely isolated from the substrate of the integrated circuit by an oxide layer of the SOI substrate, and by oxide-filled trenches formed on both sides of the varactor structure. The trenches preferably extend to the oxide layer of the SOI substrate. This alternative embodiment of the binary capacitor 200 is described more fully in a co-pending, commonly-assigned patent application, filed May 3, 1999, Ser. No. 09/304,457, entitled "Integrated Circuit Varactor having a Wide Capacitance Range,". This application is incorporated by reference herein for its teachings of P-gate/N-well varactor structures.

In another preferred embodiment, the binary capacitor 200 may be implemented as an integrated circuit varactor structure that includes an N-gate/P-well structure formed on an N-substrate bulk CMOS substrate or on an SOI CMOS substrate. The N-gate/P-well embodiment of the binary capacitor is identical to the P-gate/N-well structure of FIG. 2, with the exception that the N-gate/P-well structure uses p-type dopant materials in the place of the n-type dopant materials used in the N-well device. More specifically, and referring again to FIG. 2, in a P-well implementation of the binary capacitor 200, the well implant layer 220 is preferably lightly doped with appropriate p-type dopant materials. Similarly, the contact implant regions 222, 224 preferably comprise highly-doped P+regions diffused into the P-well implant layer 220 in the preferred P-well implementation of the binary capacitor 200 of FIG. 2.

In addition, applying a D.C. bias voltage between the N-gate terminal 234 and the electrically coupled well contact terminals 232, 236 as described above with reference to the N-well device controls the capacitance of the P-well binary capacitor 200. However, in the P-well embodiment of the binary capacitor, $V_1$ and $V_2$ are applied to the N-gate terminal 234 as negative polarity voltages with respect to the P-well contact terminals 232, 236. That is, $V_1$ and $V_2$ are applied as negative voltages with respect to the $P^+$ well contact implant regions 222 and 224. In this embodiment the binary capacitor is said to be operating in a "depletion" mode.

As described above with reference to the N-well embodiment, by applying a negative polarity D.C. bias voltage $V_{applied}$ that is equal to or less than $V_1$ (i.e., in this embodiment, equal to or more positive than $V_1$), $C_{gate-bulk}(V)=C_{LOW}$. By applying a negative D.C. bias voltage $V_{applied}$ that is equal to or greater than $V_2$ (i.e., in this embodiment, equal to or more negative than $V_2$), $C_{gate-bulk}(V)=C_{HIGH}$. As the D.C. bias voltage varies between the threshold voltages $V_1$ and $V_2$, $C_{gate-bulk}(V)$ varies between the first capacitance value $C_{LOW}$ and the second capacitance value $C_{HIGH}$ (i.e., the binary capacitor 200 behaves as a varactor in this relatively narrow voltage range). Note that in this embodiment, the applied voltage $V_{applied}$ is increased to become more and more negative (e.g., from −0.5V to −1.5V) as it changes from the "low" threshold voltage of $V_1$ to the "high" threshold voltage $V_2$.

The N-gate/P-well integrated circuit varactor structure formed on an SOI substrate is described more fully in the incorporated co-pending, commonly-assigned patent application entitled "Integrated Circuit Varactor having a Wide Capacitance Range." This patent application is incorporated by reference herein for its teachings of N-gate/P-well varactor structures.

As described in more detail below with reference to FIGS. 4–6, the binary capacitor 200 of FIG. 2 is used as an integral building block in implementing the digital capacitor 106 of FIG. 1. The digital capacitor 106 is used to improve the performance of the VCO 100 of FIG. 1. More specifically, the digital capacitor 106 is used to implement a means of calibrating (both manually and automatically) and re-centering the center output frequency of the VCO 100.

Figure 4A:
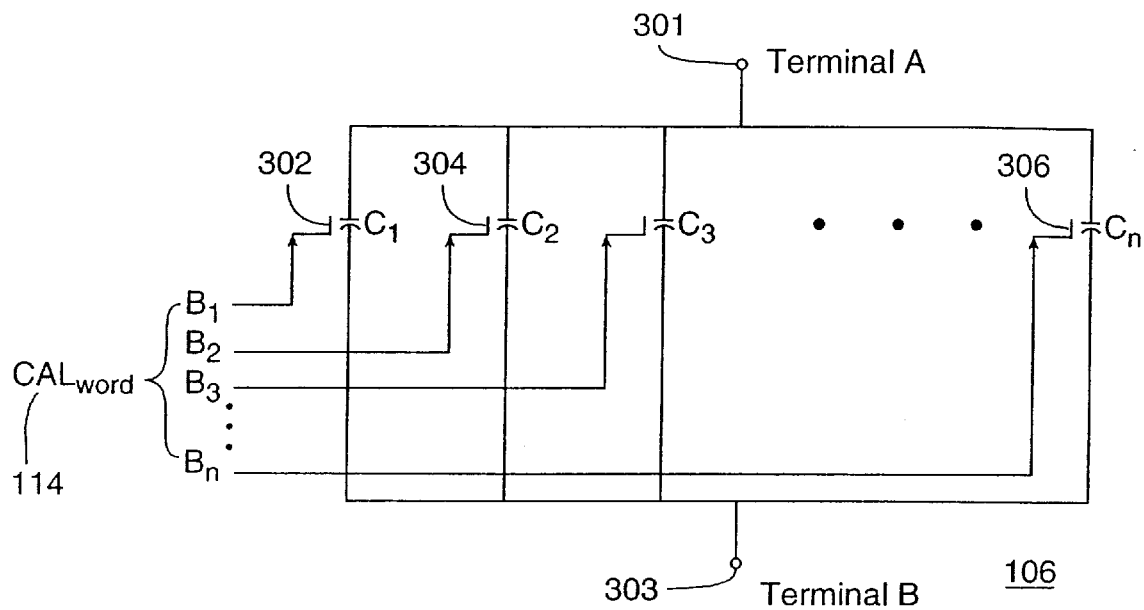
FIG. 4a is a simplified schematic showing the binary capacitor of FIG. 2 configured for use as a digitally controlled digital capacitor having a digitally selectable and variable capacitance.

FIG. 4a shows how the binary capacitor 200 described above with reference to FIGS. 2 and 3 is used to implement the digitally controlled digital capacitor 106 of FIG. 1, wherein the digital capacitor 106 has a digitally selectable and variable capacitance. As shown in FIG. 4a, a plurality of binary capacitors are preferably connected in parallel between two terminals (i.e., between terminal A 301 and terminal B 303) within an integrated circuit. The terminals A 301 and B 303 may be connected to the VCO 100 as shown in FIG. 1. In accordance with the present invention, the capacitance values of the binary capacitors are preferably weighted in a convenient and desirable manner. For example, in the embodiment shown in FIG. 4a, the binary capacitors of the multi-bit digital capacitor 106 are given a binary weighting. More specifically, the least-significant binary capacitor $C_1$ 302 is manufactured to have a desired least significant (or lowest) differential capacitance of $C_{LSB}$ (defined as the difference between $C_1$'s highest capacitance $C_{1\ HIGH}$ and $C_1$'s lowest capacitance $C_{1\ LOW}$).

The next significant binary capacitor $C_2$ 304 is preferably manufactured to have a differential capacitance of twice $C_{LSB}$, or $2*C_{LSB}$. The binary weighting is assigned in like fashion with each next significant capacitor having a differential capacitance that is a power of two greater than the previous significant capacitor. Finally, the most significant binary capacitor $C_n$ 306 is manufactured to have a differential capacitance of $2^{n-1}*C_{LSB}$. Those skilled in the IC manufacturing art will appreciate that several alternative means may be used to make the differential capacitance of a selected binary capacitor (for example, $C_2$) have a value that is a power of two greater than the previous significant capacitor (in this example, $C_1$). For example, in one embodiment, placing two previous significant capacitors (in this example, C1) in parallel can form the selected capacitor (e.g., C2). Similarly, placing four of the previous significant capacitors (e.g., C1) in parallel can form the next significant capacitor (e.g., C3). Alternatively, the capacitors may be manufactured to different physical dimensions to have the desired differential capacitance characteristics.

In addition, although the binary capacitors of the embodiment shown in FIG. 4a are given a binary weighting, those skilled in the art will recognize that any convenient capacitance weighting scheme can be assigned to the capacitors. For example, in an alternative embodiment where a logarithmic scaling is desired, each binary capacitor can be manufactured to have a capacitance value that is ten times greater than its previous significant capacitor. More specifically, binary capacitor $C_2$ 304 can be manufactured to have a differential capacitance that is $10*C_{LSB}$, where $C_1$ 302 is manufactured to have a differential capacitance of $C_{LSB}$. In this embodiment, $C_n$ is assigned a differential capacitance of $10^{n-1}*C_{LSB}$.

Referring again to FIG. 4a, the differential capacitance of each binary capacitor of the digital capacitor 106 is individually controlled by an associated and respective digital control signal that is applied over the terminals of the associated binary capacitor (i.e., by an associated and respective digital bit of a digital control word applied between the respective gate and well contact terminals). The control bits are ordered from least significant bit (LSB) to most significant bit (MSB), and are assigned to control the least significant capacitor to the most significant capacitor. Accordingly, the binary capacitors are ordered from least significant to most significant. For example, as shown in FIG. 4a, the least significant bit LSB, $B_1$ of the digital control word is preferably applied over the terminals of the least significant binary capacitor $C_1$ 302 and thereby controls the capacitance of the binary capacitor $C_1$ 302. The next most significant bit, $B_2$, is applied to the terminals of the binary capacitor $C_2$ and thereby controls its capacitance. The most significant bit, $B_n$, similarly controls the capacitance of binary capacitor $C_n$.

As described above with reference to FIGS. 2 and 3, when $B_1$, for example, is a logical low value, or D.C. for example, the capacitance of binary capacitor $C_1$ 302 is equal to a first lower capacitance $C_{1\ LOW}$. Alternatively, when $B_1$ is a logical high value, or VCC for example, the capacitance of the binary capacitor $C_1$ 302 is equal to a second higher capacitance $C_{1\ HIGH}$ The differential between $C_{1\ HIGH}$ and $C_{1\ LOW}$ is equal to $C_{LSB}$. Similarly, when $B_2$, for example, is a logical low value, or D.C., the capacitance of $C_2$ is equal to $C_{2\ LOW}$. When $B_2$ is a logical high value, or VCC, the capacitance of binary capacitor $C_2$ is equal to $C_{2\ HIGH}$. Due to the binary weighting of C2, the differential capacitance of C2 (i.e., the difference between $C_{2\ HIGH}$ and $C_{2\ LOW}$) is equal to $2*C_{LSB}$. The trend continues as such, with each next significant binary capacitor having a differential capacitance that is twice the differential capacitance of its previous significant capacitor. Finally, as shown in FIG. 4a, the capacitance of binary capacitor $C_n$ 306 varies between $C_{n\ LOW}$ and $C_{n\ HIGH}$, as $B_n$ varies between a logic low and logic high value. Again, due to the binary weighting of the capacitors the differential capacitance between $C_{n\ HIGH}$ and $C_{n\ LOW}$ is approximately equal to $2^{n-1}*C_{LSB}$.

Figure 4B:
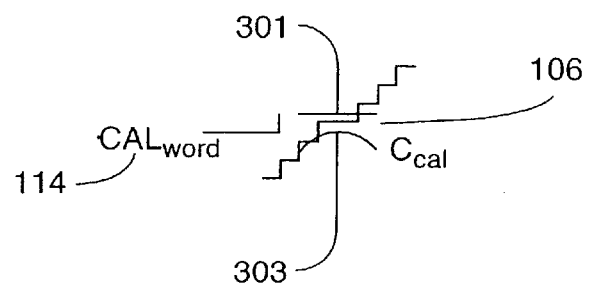

Because the plurality of binary capacitors are connected together in a parallel configuration as shown in FIG. 4a, their respective capacitance values combine by simply adding the capacitance values of all of the individual binary capacitors. The capacitance of the digital capacitor 106 (as measured between the terminals A 301 and B 303) is therefore equal to the sum of the capacitance of each of the binary capacitors $C_n$. FIG. 4b is a simplified schematic representation of the digital capacitor 106 shown in FIG. 4a.

Figure 5:
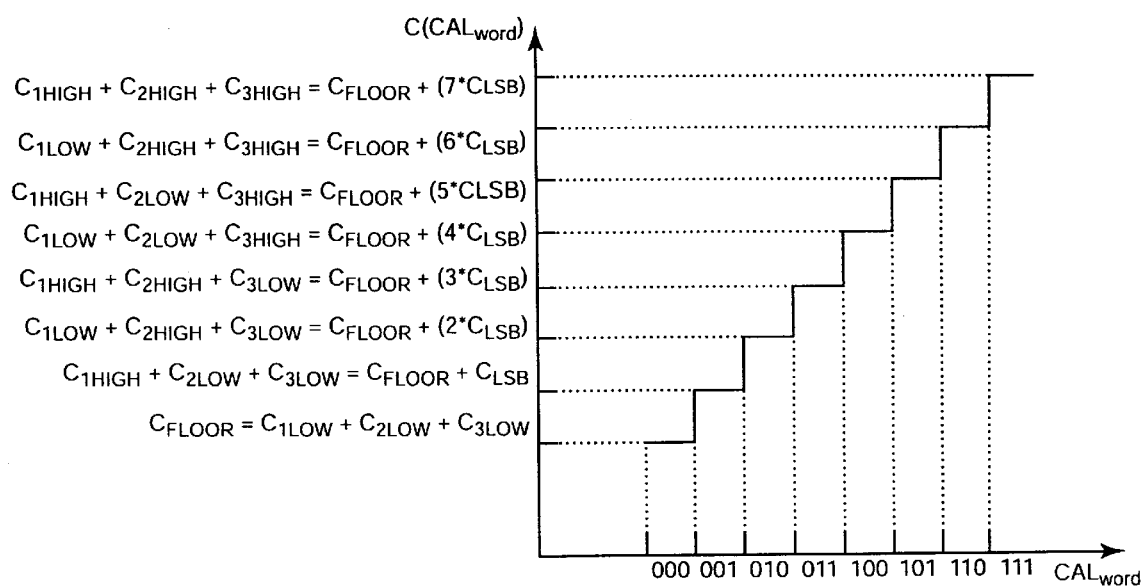

FIG. 5 shows a plot of the capacitance of the digital capacitor 106 as it varies depending upon the digital control word $CAL_{word}$ 114 applied over the terminals of the plurality of binary capacitors. In the example shown, $CAL_{word}$ is assumed to be three bits wide and therefore, in this embodiment, the number of binary capacitors used to implement the digital capacitor 106 is three. As shown in FIG. 5, the lowest capacitance value $C_{FLOOR}$ is produced when the control word $CAL_{word}$ 114 is set equal to all zeros (e.g., assuming a three-bit control word, n=3, $CAL_{word}$=000). Here, $C_{FLOOR}=C_{1\ FLOW}+C_{2\ LOW}+C_{3\ LOW}$. The next higher capacitance value is produced using a control word $CAL_{word}$ of "001". In this case, the capacitance of the digital capacitor 106 is equal to $C_{1\ HIGH}+C_{2\ LOW}+C_{3\ LOW}$, or $C_{FLOOR}+C_{LSB}$. By increasing the value of $CAL_{word}$ by one to "010", the capacitance of the digital capacitor 106 is increased to the next step to a value of $C_{1\ LOW}+C_{2\ HIGH}+C_{3\ LOW}$, or $C_{FLOOR}+(2*C_{LSB})$. The digital control word $CAL_{word}$ can be similarly incremented to produce the capacitance plot shown in FIG. 5. The capacitance of the digital capacitor 106 has its highest capacitance $C_{MAX}$ equal to $C_{1\ HIGH}+C_{2\ HIGH}+C_{3\ HIGH}$ when the digital control word $CAL_{word}$ is set equal to "111". Stated in other terms, the highest capacitance $C_{MAX}$ of the digital capacitor is $C_{FLOOR}+(7* C_{LSB})$.

Figure 6:
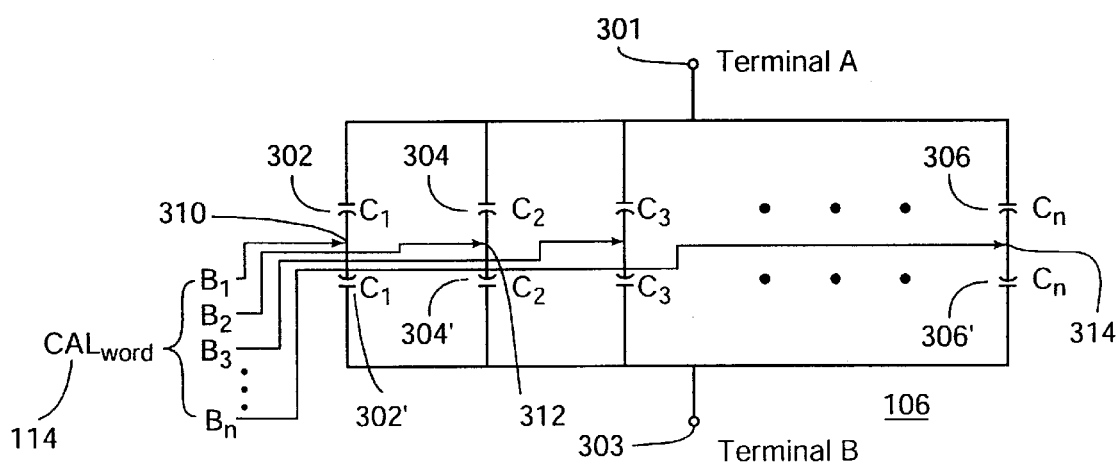

FIG. 6 shows a differential mode implementation of the digital capacitor 106 described above with reference to FIGS. 1–5. The digital capacitor 106 is preferably implemented differentially because this provides a convenient third terminal for digitally controlling the capacitance values of the binary capacitors. For example, as shown in FIG. 6, the control signal $B_1$ is applied between the binary capacitors $C_1$ 302, 302' at a control terminal 310. Similarly, the control signal $B_2$ is applied between the binary capacitors $C_2$ 304, 304' at a control terminal 312. The most significant control bit of the digital control word $CAL_{word}$ 114, $B_n$, is applied between the binary capacitors $C_n$, 306, 306' at a control terminal 314. The control terminals are common mode AC grounds.

The differential mode implementation of the digital capacitor 106 functions similarly to the digital capacitor 106 described above with reference to FIGS. 4–5. For example, the binary capacitors are preferably assigned a binary weighting, with the least significant capacitors $C_1$ 302, 302' having the lowest capacitance ($C_{LSB}$). As shown in FIG. 6, the differential capacitance of the binary capacitors 302, 302' is controlled at the control terminal 310 by the LSB of the digital control word $CAL_{word}$, i.e., by $B_1$. The differential capacitance of the next significant binary capacitors $C_2$ 304, 304' is twice that of the least significant capacitors $C_1$, or $2*C_{LSB}$. The capacitance of the binary capacitors $C_2$ 304, 304' is similarly controlled at the control terminal 312 by the next most significant bit of the digital control word $CAL_{word}$, i.e., by $B_2$. The width of the control word $CAL_{word}$ corresponds to the number of binary capacitor pairs used in the differential mode implementation of the digital capacitor 106. The differential capacitance of the most significant binary capacitors is equal to $(2^{n-1}*C_{LSB})$. The MSB of the control word, i.e., $B_n$, controls the differential capacitance of the binary capacitors $C_n$ 306, 306'. Thus, the total capacitance of the differential mode implementation of the digital capacitor 106 is as follows:

$$C_{total}=C_{FLOOR}+B_1'C_{LSB}+B_2'(2*C_{LSB})+B_3'(4*C_{LSB})+ \ldots +B_n'*(2^{n-1}C_{LSB});$$

where the control word bits $B_n'$ determine whether the differential capacitance of the $_n$th capacitor ($C_{LSB}$ or a multiple of $C_{LSB}$ in the case when n is higher than 2) is or is not added to $C_{FLOOR}$. More specifically, if $B_n'$ is a logical zero, the differential capacitance of the $_n$th capacitor is not added (i.e., $C_{LSB}$, or its multiple, is not added to $C_{FLOOR}$ for the nth capacitor). If $B_n'$ is a logical one, then the differential capacitance of $C_{LSB}$ (or its multiple in the case of higher order bits) is added to $C_{FLOOR}$ for the $_n$th capacitor.

Thus, by varying the value of the digital control word $CAL_{word}$ 114 appropriately, and thereby varying the capacitance of each individual binary capacitor (i.e., binary capacitor $C_1$ 302, $C_2$ 304, ... $C_n$ 306), the capacitance of the digital capacitor 106 can be customized to any desired value. The step size shown in FIG. 5 (i.e., the resolution of the capacitance of the digital capacitor 106) depends upon the number of bits used (with a corresponding number of binary capacitors used) to implement the digital control word $CAL_{word}$. The digital capacitor 106 is used in the VCO 100 of FIG. 1 to calibrate the center output frequency of the VCO 100 and to provide a coarse tuning control device for the VCO.

The digital capacitor 106 is described in more detail in a co-pending, commonly assigned patent application, filed May 3, 1999, Ser. No. 09/304,443, entitled "Method and Apparatus for Digitally Controlling the Capacitance of an Integrated Circuit Device Using MOS-Field Effect Transistors,", incorporated herein for its teachings of binary capacitors, digital capacitors, and their use in tuned capacitor networks. As described therein, the digital capacitor can be used to re-center the LC-resonance frequency to a desired center frequency value. Calibration of the LC-resonator center frequency can be performed using either manual or automatic calibration methods.

Use of the Digital Capacitor 106 in Implementing the Inventive Fully-Integrated VCO Referring again to FIG. 1, as is well known in the electrical engineering arts, the VCO center output frequency $f_0$ depends upon the total capacitance seen by the VCO LC-resonator. More specifically, the center output frequency $f_0=1/(2\pi*\text{SQRT}(L*C_{tot}))$. The high Q inductors 102 fix the value of L. However, the value of $C_{tot}$ is variable and is determined by the combined capacitance of the tuning varactor 104 and the capacitance of the digital capacitor 106. The capacitance of the tuning varactor 104 is controlled by the analog tuning voltage $V_{tune}$ 112. The capacitance of the digital capacitor is digitally controlled by the digital control word $CAL_{word}$ 114.

In practice, the VCO 100 is tuned so that the center output frequency $f_0$ is set to be nominally equal to a desired center frequency, for example, 2 GHz. Disadvantageously, when the VCO is implemented in an integrated circuit, poor tolerance values due to IC fabrication process variations and other factors can adversely affect the desired tuned center frequency. Consequently, the prior art IC VCO disadvantageously are unreliable due to variations between integrated circuits. Using the digital capacitor 106 described above with reference to FIGS. 1–6, the inventive VCO 100 of FIG. 1 advantageously compensates for the IC process variations by calibrating and re-centering the VCO center output frequency $f_0$. The center output frequency $f_0$ can be calibrated and re-centered by varying the digital control word $CAL_{word}$ and thereby adjusting the capacitance of the digital capacitor 106.

Advantageously, despite process variations in the fabrication of integrated circuits, the inventive VCO 100 of FIG. 1 allows circuit designers to accurately control the center frequency of the integrated circuit VCO 100. This is essential in some applications, especially when the VCO operates at relatively high frequencies.

In addition, given a set of tunable frequency ranges, the present invention provides a VCO 100 having much lower gain and sensitivity characteristics than prior art VCO designs. Owing to the calibration function provided by the digital capacitor 106, and because the digital capacitor and digital control word are used to coarsely tune the VCO output frequency, the fully integrated VCO 100 need be tunable only over a relatively narrow frequency range (i.e., the VCO 100 only has to cover the change in frequency equivalent to 1 LSB, each calibration range only needing to slightly overlap the previous range) as compared with the prior art VCO designs. Therefore, the present inventive IC VCO 100 is much less noise sensitive than are the prior art IC VCO designs. The present IC VCO 100 performs better and is easier to implement that its prior art counterparts because it is less sensitive to low frequency noise and the deleterious effects of interfering RF signals.

High Q Inductors

The high Q inductors 102 used in implementing the VCO 100 of FIG. 1 preferably comprise integrated circuit inductor structures that include a shielding pattern that induces a plurality of small eddy currents to shield magnetic energy generated by the inductors from the IC substrate. The high Q inductors 102 are described in more detailed in co-pending, commonly assigned patent application, filed May 3, 1999, Ser. No. 09/304,137, entitled "Integrated Circuit Inductor with High Self-Resonance Frequency,", incorporated herein for its teachings on high Q inductors. As described therein, the inductor structure is preferably formed on an SOI substrate where the substrate has high resistivity.

In one embodiment of the high Q inductors 102, the shielding pattern forms a checkerboard pattern that includes a plurality of conducting regions completely isolated from each other by a dielectric or non-conducting material. The inductor 102 has a high quality factor and a high self-resonance frequency due to the effective shielding of electromagnetic energy from the IC substrate while not reducing the effective inductance of the inductor or introducing substantial parasitic capacitance.

In other embodiment of the high Q inductors 102, the IC inductor structure includes an inductor formed over a second dielectric layer. The second dielectric layer is formed over a first dielectric layer and the first dielectric layer is formed over a substrate. The substrate preferably has high resistivity. In particular, the resistivity is approximately 1 kohm-cm. The first dielectric layer is formed from silicon oxide and the second dielectric layer is formed from at least one oxide layer. In another embodiment, a plurality of conducting regions are inserted into the second dielectric layer wherein the plurality of conducting regions induce small eddy currents that do not significantly reduce the inductance of the inductor.

The high Q inductor 102 has a high quality factor and high self-resonance (the high point of the quality factor occurs at the highest operating frequency). As described in the co-pending incorporated patent application, the inclusion of a high resistivity IC substrate greatly increases the quality factor and self-resonance frequency of the inductors 102. In addition, as described in the incorporated patent application, an isolation technique is used to isolate the inductor 102 from neighboring IC components. In high frequency applications, higher isolation techniques may be required. In these applications, the inductors 102 are preferably isolated using a guard ring configuration that is described in detail in a commonly assigned application entitled "Trench Isolated Guard Ring Region for Providing RF Isolation" filed Feb. 23, 1999 and assigned application Ser. No. 09/255,747, abandoned, and in a co-pending and commonly assigned application entitled "A Multi-Chambered Trench Isolated Guard Ring Region for Providing RF Isolation", filed Aug. 22, 200, and assigned application Ser. No. 09/643,575. These applications are hereby incorporated by reference for their teachings on guard ring region isolation techniques.

As described in the co-pending applications, the high Q inductor 102 is inserted in a mesa formed by a guard ring including by U-trenches immediately surrounding the inductor. Each U-trench has adjacent CN and NBL conductive regions coupled by a metal contact to a ground. The conductive regions are also surrounded by U-trenches. As described in the copending and incorporated application (the "Guard Ring" application), the guard ring isolation configuration further isolates the IC inductor from neighboring IC components.

As noted above, the inductor is preferably formed on an SOI substrate, using well-known SOI BiCMOS IC manufacturing processes. An insulating layer separates circuit devices from a solid silicon substrate. The advantages of SOI BiCMOS process technology include greater signal isolation, higher speed devices with lower power consumption, and dense digital CMOS logic. The circuitry of the present invention is preferably implemented in an SOI BiCMOS process technology that uses bonded wafers ("bonded SOI"). Bonded SOI processes are well known to those of ordinary skill in the art and are believed to be currently available.

Exemplary SOI BiCMOS process technologies that may be used to implement the present invention are described in U.S. Pat. No. 5,661,329 entitled "Semiconductor Integrated Circuit Device Including An Improved Separating Groove Arrangement", U.S. Pat. No. 5,773,340 entitled "Method of Manufacturing a BIMIS", and U.S. Pat. No. 5,430,317 entitled "Semiconductor Device", the complete disclosures of which are all hereby fully incorporated into the present application by reference for their teachings of SOI BiCMOS process technology.

As described above, the high Q inductors 102 of FIG. 1 have reduced Local Oscillation (LO) radiation energy into the IC substrate. Not only does this improve the performance of the VCO (by further increasing the tuning range), the reduction of radiated noise energy improves the performance of other IC circuits. This is particularly useful in mixed signal environments where it is important to minimize noise radiated into the IC substrate. In addition, owing to the isolation techniques and the implementation of the inductors on an SOI substrate, the inductors are implemented without a well-to-substrate junction, and therefore introduce less parasitic capacitance into the substrate. What capacitance is introduced is linear. These characteristics of the inductors 102 advantageously reduce the noise sensitivity of the VCO 100, increase the VCO tuning range, improve the reliability and reproducibility of the VCO from IC to IC, and enhance the applicability of the VCO 100 to a wide variety of applications such as use in mixed signal environments. Consequently, the inductors 102 aid in improving the overall performance of the inventive fully integrated VCO 100.

Analog Tuning Varactors

As described above with reference to FIGS. 1–6, the center output frequency of the VCO 100 is preferably "fine-tuned" using the analog tuning varactors 104. As shown in FIG. 1 and described above, the capacitance of the tuning varactors 104, and thereby the center output frequency, is controlled by the analog control signal $V_{tune}$ 112. The analog tuning varactors 104 of the present invention preferably have increased capacitance tuning ranges. That is, the capacitance of the tuning varactors 104 preferably can be varied by a large tuning factor. In one embodiment, the capacitance of the tuning varactors 104 can be varied by a factor of three or four.

The tuning varactors 104 of the present invention are described more fully in previously incorporated, co-pending, commonly-assigned patent application, filed May 3, 1999, Ser. No. 09/304,457, entitled "Integrated Circuit Varactor having a Wide Capacitance Range." As described therein, the tuning varactors 104 preferably include either a P-gate/N-well or N-gate/P-well layer structures preferably formed on an SOI substrate. In one preferred embodiment of the present fully-integrated VCO 100, the varactors 104 comprise N-gate/P-well varactor structures wherein the capacitance of the varactors change relatively slowly from a first lower capacitance to a second higher capacitance as the control voltage is changed from a first voltage threshold $V_1$ to a second voltage threshold $V_2$. Alternatively, a P-gate/N-well varactor structure can be used to implement the varactors 104.

As described in the incorporated application (the "Varactor" application), in one embodiment, the varactor is isolated from the IC substrate by an oxide layer of the SOI substrate and by oxide-filled trenches formed on both sides of the varactor structure. The trenches preferably extend to the oxide layer of the SOI substrate. As a consequence, and similar to the inductors described above, no well-to-substrate junction exists in the varactor device. Consequently, as described above, the tuning varactor 104 does not introduce significant parasitic capacitance into the IC substrate. Any capacitance that is introduced is linear. As described above, because the varactor 104 does not introduce significant parasitic capacitance into the substrate, and because no non-linear capacitance is introduced, the varactor 104 reduces the sensitivity of the VCO to low frequency energy occurring in the IC substrate. The tuning varactor also provides an improved tuning capacitance range, which, in turn, increases the frequency tuning range of the fully integrated VCO. In addition, as described above, use of the analog tuning varactor for fine-tuning the output frequency of the VCO also reduces the VCO noise sensitivity.

A Preferred Embodiment of the Fully-Integrated VCO of the Present Invention

Figure 7:
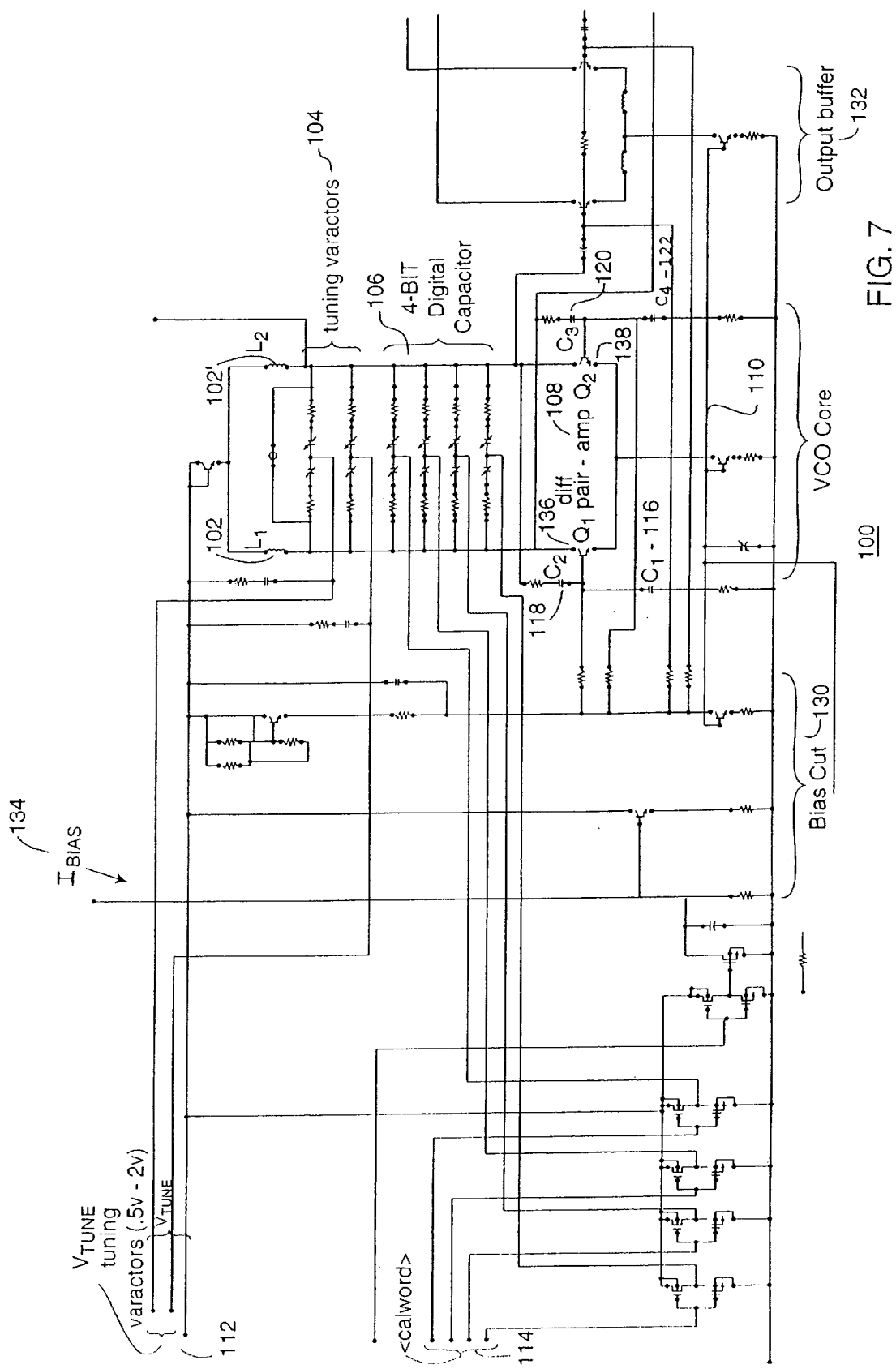
FIG. 7 is a detailed schematic of the integrated VCO of FIG. 1.

FIG. 7 shows a detailed schematic of the preferred integrated VCO 100 of FIG. 1. In the embodiment of the VCO 100 shown in FIG. 7, the VCO 100 preferably comprises a pair of high Q inductors 102 and 102', two pairs of analog tuning varactors 104, a multi-bit digital capacitor 106, a differential pair amplifier 108, a current source 110, feedback and bias capacitors 116, 118, 120, and 122, bias circuitry 130, and output buffer circuitry 132. The inductors $L_1$ 102 and $L_2$ 102' preferably comprise high Q inductors as described in detail above with reference to FIG. 1. As described above with reference to FIG. 1, the analog tuning varactors 104 are preferably controlled by an analog tuning voltage $V_{tune}$ 112. In the embodiment shown in FIG. 7, the VCO 100 uses two differential analog tuning varactors 104. Two differential tuning varactors 104 are used in the embodiment shown to permit access to two tuning control ports at $V_{tune}$ 112, (labeled "$V_{ctrl-low}$" and "$V_{ctrl-high}$" in FIG. 7). The two control ports allow the designer to select between two possible VCO gain settings (low and high gain settings). This allows some flexibility in the VCO design when the desired gain setting is unknown. In typical embodiments where the desired gain setting is known, only one varactor pair is necessary.

As described above with reference to FIG. 1, the analog tuning varactors 104 are used to "fine-tune" the VCO center output frequency $f_0$. The analog tuning voltage $V_{tune}$ 112 controls the capacitance of the analog tuning varactors 104, which, in turn, controls the center output frequency of the VCO 100. The VCO center output frequency is coarse-tuned by the digital control word 114 and the multi-bit digital capacitor 106. In the embodiment shown in FIG. 7, the digital capacitor 106 is four-bits wide. Other size digital capacitors 106 can be used without departing from the scope of the present invention. As shown in FIG. 7, the digital capacitor 106 is coupled to the differential pair amplifier 108 and the current source 110. The differential pair amplifier preferably comprises a pair of transistors $Q_1$ 136 and $Q_2$ 138 connected as shown in FIG. 7. The bias voltages of the transistors 136, 138 are established and controlled in a known manner by the bias circuit 130. A bias current $I_{bias}$ 134 is generated elsewhere on the IC (not shown) and provides the bias current to the bias circuit 130. The center output frequency generated by the VCO 100 is buffered as shown by output buffer circuitry 132. The VCO 100 of FIG. 7 functions as described above with reference to FIGS. 1–6.

Figure 8:
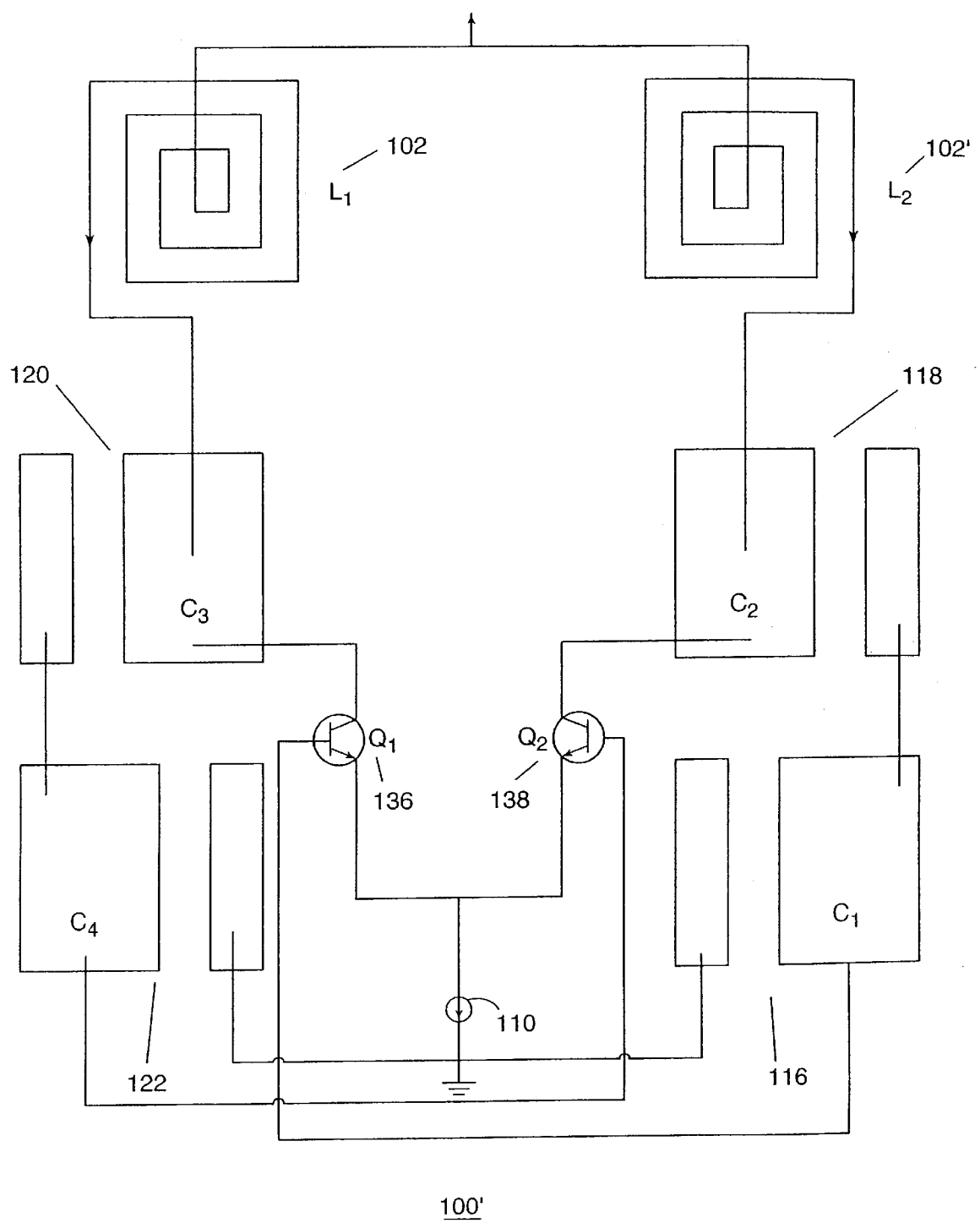
FIG. 8 is a simplified block diagram showing some details of the preferred integrated circuit layout of the VCO 100 of FIGS. 1 and 7.

FIG. 8 is a simplified block diagram showing some details of the preferred integrated circuit layout of the VCO 100 of FIGS. 1 and 7. For simplification purposes some details of the layout of the VCO 100 are not shown in FIG. 8 (such as the interconnection of the varactors 104 and the digital capacitor 106, for example). The layout 100' of the VCO shown in FIG. 8 provides a very low noise oscillator circuit having very low resistance values associated with the interconnecting metal lines (interconnection wiring). An important goal in laying out the VCO 100 is to reduce the series resistance introduced by interconnection wiring in the oscillator circuit. This is important in producing a very low noise oscillator because low noise oscillators can tolerate very little resistance introduced by the interconnection wiring. The layout of FIG. 8 aids in reducing series resistance introduced by interconnection wiring along critical paths of the LC oscillator circuit.

As shown in FIG. 8, the inductors $L_1$ and $L_2$, 102 and 102', respectively, are preferably laid out on the integrated circuit relatively proximate each other. In addition, the inductors 102, 102' are preferably oriented such that the other inductor cancels the electric fields induced by one inductor. That is, as shown in FIG. 8, the inductors should be oriented such that the electric field induced by the inductor $L_1$ 102 is cancelled by the electric field induced by $L_2$ 102'. As described above, the layout shown of FIG. 8 minimizes the series resistance associated with critical interconnection paths, interconnections between critical components of the VCO 100. This reduction in series resistance is accomplished by keeping the interconnection wires along critical interconnection paths as short as possible.

More specifically, and referring again to FIG. 8, the feedback capacitor 120 is preferably positioned so that a critical interconnection path between the inductor $L_1$ 102 and the collector of the transistor $Q_1$ 136 is reduced. Similarly, the feedback capacitor 118 is preferably positioned so that a interconnection critical path between the inductor $L_2$ 102' and the collector of the transistor $Q_2$ 138 is also reduced. These reductions in distances along the critical paths result in reductions to series resistances. These interconnection paths are critical (and thus require reduced series resistance) because the majority of the current in the LC oscillator circuit flows through the tank circuits. Consequently, by making the interconnection wiring between the inductors and the transistor collectors as short as possible (by positioning the feedback capacitors as shown), the resistance (and thus the loss) introduced into the LC tank circuits are reduced.

Note that the advantages in reducing the interconnection wiring as shown comes at the cost of increasing the interconnection between the feedback capacitors $C_1$ 116 and $C_4$ 122 and the bases of the transistors 136 and 138, respectively. However, these interconnection paths are not considered to be critical because the impedance looking into the transistor bases are very high as compared with the impedance of the tank circuits. The consequence of this is that the current flowing into the transistor bases is far less than the current flowing into the transistor collectors and through the LC tank circuits. Therefore, the lengthened interconnection wires to the transistor bases do not add additional loss into the circuit.

Figure 9:
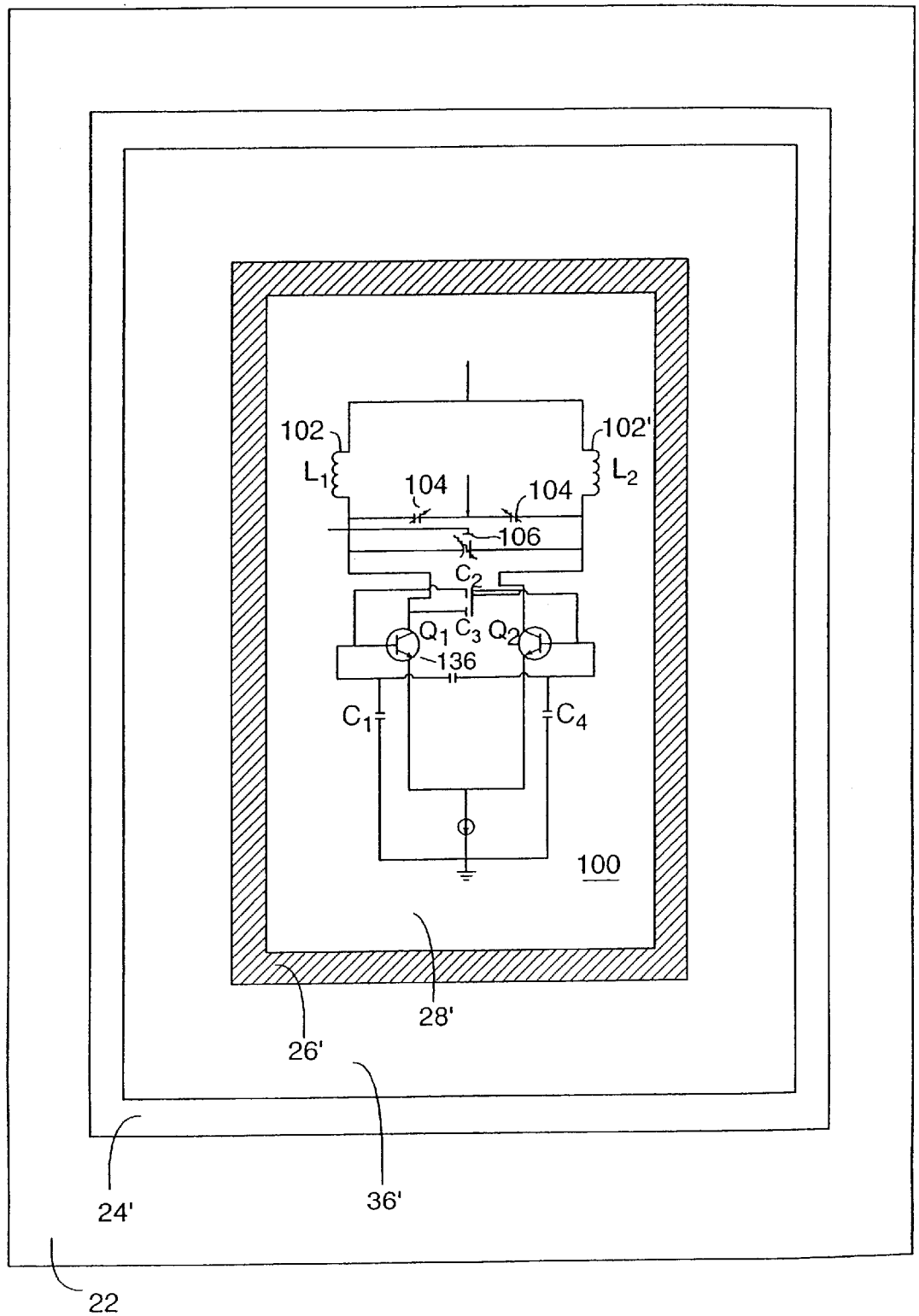
FIG. 9 is a simplified block diagram of an IC layout of the VCO 100 of FIGS. 1, 7 and 8, showing the VCO block surrounded by a "super-trench" isolated guard ring region.

FIG. 9 shows a simplified block diagram of an IC layout of the VCO 100 of FIGS. 1, 7 and 8, showing the VCO surrounded by a "super-trench" isolated guard ring region that provides isolation for the entire VCO structure. As described above with reference to FIG. 1, a trench isolated guard ring region preferably isolates each device of the VCO. As described in the co-pending, commonly assigned, and incorporated patent application, entitled "Trench Isolated Guard Ring Region for Providing RF Isolation" filed Feb. 23, 1999, improvements in isolation (such as RF power isolation) between IC devices can be provided by surrounding each device with a trench isolated guard ring region. Two isolation trenches isolate each device "mesa", within which a selected device is positioned. The isolation trenches define guard ring regions. The isolation trenches may be filled with silicon oxide or some other insulating material such as oxide/polysilicon. As described in the incorporated application, the isolated device mesas may comprise many different types of IC devices such as transistors, diodes, capacitors, varactors, etc. Metal contacts are made to the guard ring regions to provide a low resistance RF ground that is preferably coupled to an RF ground node in the IC.

Referring now to FIG. 9, each device of the VCO 100 (i.e., the inductor $L_1$ 102, the varactors 104, the transistor 136, etc.) is preferably isolated from every VCO device by isolation trenches and isolation guard rings associated with the selected device. As described above, the VCO 100 is preferably formed on a high resistivity SOI substrate. The noise sensitivity of the VCO 100 is greatly reduced by separately isolating each of the VCO 100 devices using the trench isolated guard ring region isolation techniques described in the co-pending and incorporated application, and by implementing the VCO on an SOI substrate. In addition, as shown in FIG. 9, the entire VCO block 100 is preferably isolated from other IC blocks using a "super-trench" guard ring region 36' that surrounds the entire VCO block 100. The "super-trench" guard ring region 36' is preferably formed in a manner similar to the formation of the guard ring region described in the co-pending patent application.

More specifically, and referring again to FIG. 9, the IC preferably includes a single SOI substrate 22. The SOI substrate 22 preferably includes two super isolation trenches, 24', 26', similar in construction to the isolation trenches 24, 26 described in the co-pending application. The super isolation trenches 24' and 26' isolate a VCO block super mesa 28' from other IC block super mesas. The super isolation trenches 24' and 26' isolate the VCO block mesa 28' from noise energy and other interfering signals that could adversely affect the performance of the VCO 100.

The super isolation trenches 24', 26' define the super guard ring region 36' therebetween. The super guard ring region 36' surrounds the super mesa 28' and is isolated from other super mesas (not shown) that include other circuit blocks by the super isolation trench 24'. The super isolation trench 24' isolates the super guard ring region 36' from surrounding field epitaxial regions in the substrate 22. An NBL preferably extends into the super guard ring region 36', and a CN is also implanted into the super guard ring region 36'. Metal contacts (not shown) are preferably made to the CN of the super guard ring region 36' to provide a low resistance RF ground along a conductor (not shown). The conductors are preferably coupled to an RF ground node.

The super guard ring region 36' provides excellent RF isolation for the VCO 100. One reason for this excellent RF isolation is that electric fields created by RF power are terminated by the shunt to RF ground conductors. Having these RF grounds around the super mesa 28' greatly improves RF isolation. Another reason for the excellent RF isolation is the use of SOI. The insulating layer of the SOI provides additional RF isolation. Finally, the use of a high resistivity (or high Z) substrate improves RF isolation by making the substrate a high resistance path for RF power. Any leaking RF power will prefer the path of least resistance, which will not be the substrate 22 if a high Z substrate is used.

The super guard ring region 36' is completely isolated by the super isolation trenches 24' and 26' and by the insulating layer of the SOI substrate 22. This allows for easy bias of the super guard ring region 36'. The low resistivity super guard ring region 36' provides an excellent RF ground shunt for the super device mesa 28'. Furthermore, the low capacitance super guard ring structure 36' does not impact junction capacitance "Cjs". Specifically, the super guard ring region 36' has very little impact on Cjs because the oxide in the trenches surrounding the super device mesa 28' dominates the Cjs. The heavily doped super guard ring region 36' helps keep the region around the super device mesa 28' at an AC or RF ground potential. The substrate 22, if a high resistivity or "high Z" (e.g. 1KΩ-cm) substrate, contributes less to Cjs than does standard resistivity (10–30 Ω-cm) material. In addition, with a high Z substrate, RF power will take the path of least resistance through the lower resistivity epitaxial layers. This RF power is then shunted out to ground through the guard ring region 36'. Also, because the Cjs (with a high Z substrate) are dominated by the side wall super trench 26', additional RF power that leaks will go out of the side as opposed to the substrate 22. A more detailed description of the isolated guard ring techniques that are adapted for use by the present fully integrated VCO 100 is provided in the co-pending, commonly assigned application.

As is well known, due to the high gain associated with VCO designs, IC VCO implementations are typically very noise sensitive. Any parasitic junction capacitance from the VCO block 100 to the substrate 22 will adversely affect the performance of the VCO 100.

This is especially true if the junction capacitance is non-linear (i.e., exhibits voltage dependency). This is because any noise or other interfering signals propagated through the substrate 22 will be received by the VCO and will FM-modulate the VCO center output frequency. The disadvantages associated with prior art IC VCO implementations are overcome by the IC VCO implementation of FIG. 9. The trench guard ring isolation techniques reduce and practically eliminate resistive paths that otherwise might exist between the VCO 100 and other IC blocks. The super trench guard ring 36' isolates the VCO 100 from undesirable signals introduced into the substrate 22 by other IC circuit blocks. This is especially advantageous in a mixed signal environment.

In addition, the super-trench implementation of FIG. 9 introduces no non-linear junction capacitance between the VCO 100 and the substrate 22. Owing to the guard ring isolation techniques and implementation on an SOI substrate, no junction exists between the well and the substrate. Therefore, all capacitance between the VCO 100 and the other epitaxial layers of the substrate 22 are linear and therefore exhibit no voltage dependency. This greatly improves the performance of the inventive VCO when compared to prior art designs.

A number of embodiments of the present invention have been described. Nevertheless, it will be understood that various modifications may be made without departing from the spirit and scope of the claimed invention.

Accordingly, it is to be understood that the invention is not to be limited by the specific illustrated embodiment, but only by the scope of the appended claims.

What is claimed is:

1. A frequency adjustable oscillator having a variable and selectable oscillation frequency, the oscillator comprising:
   a) at least one inductor;
   b) a plurality of N multiple capacitance level capacitors coupled together in a parallel configuration each multiple capacitance level capacitor having a plurality of steady-state capacitance levels, the N multiple capacitance level capacitors coupled in parallel with the at least one inductor, wherein the multiple capacitance level capacitors are operatively coupled to associated and corresponding N digital control signals; and c) at least one variable capacitance level capacitor coupled in parallel with the N multiple capacitance level capacitors, the capacitance level of the at least one variable capacitor responsive to an analog control signal.

2. The frequency adjustable oscillator according to claim 1, wherein the capacitance measured across the N multiple capacitance level capacitors has at least $2^N$ distinct values.

3. The frequency adjustable oscillator according to claim 2, wherein each multiple capacitance level capacitor is coupled to one of the N digital control signals, in a one to one relationship, and wherein the steady-state capacitance level measured across each multiple capacitance level capacitor varies as a function of its associated and corresponding control signal, and wherein the oscillation frequency of the oscillator is varied by varying the N digital control signals.

4. The frequency adjustable oscillator according to claim 3, wherein the N digital control signals each have a first and a second predetermined value, and wherein each multiple capacitance level capacitor has a first steady-state capacitance level when its respective and corresponding digital control signal is less than or equal to the first predetermined value and has a second steady-state capacitance level when the corresponding digital control signal is greater than or equal to the second predetermined value.

5. The frequency adjustable oscillator according to claim 4, wherein the difference between the first steady-state capacitance level and the second steady-state capacitance level for each multiple capacitance level capacitor is the differential capacitance of the capacitor and each of the N multiple capacitance level capacitors has a different differential capacitance.

6. The frequency adjustable oscillator according to claim 5, wherein the multiple capacitance level capacitor having the next to lowest differential capacitance includes two multiple capacitance level capacitors coupled together in parallel, wherein each of the two capacitors in parallel has the lowest differential capacitance.

7. The frequency adjustable oscillator according to claim 5, wherein the ratio of the differential capacitance of the multiple capacitance level capacitor having the Nth lowest differential capacitance to the differential capacitance of the multiple capacitance level capacitor having the (N-1)th lowest differential capacitance is approximately equal to a fixed predetermined number for N equal from 1 to (N-1).

8. The frequency adjustable oscillator according to claim 5, wherein the ratio of the differential capacitance of the multiple capacitance level capacitor having the Nth lowest differential capacitance to the differential capacitance of the multiple capacitance level capacitor having the (N-1)th lowest differential capacitance is approximately equal to two for N equal from 1 to (N-1).

9. The frequency adjustable oscillator according to claim 5 wherein the plurality of multiple capacitance level capacitors, at least one inductor, and at least one variable capacitor are formed on an integrated circuit "IC".

10. The frequency adjustable oscillator according to claim 9, the IC comprising:

a) a substrate;
b) a first insulating layer formed on the substrate; and
c) a first semiconductor layer formed on the insulating layer.

11. The frequency adjustable oscillator according to claim 10, wherein each multiple capacitance level capacitor includes:

a) one of an N-well and P-well implant layer formed in the first semiconductor layer;
b) a first region of one of a N+ and a P+ implant formed in the one of an N-well and P-well implant layer;
c) a second region of one of a N+ and a P+ implant formed in the one of an N-well and P-well implant layer;
d) a second insulating layer form over a portion of the surface of the one of an N-well and P-well implant layer; and
e) a second semiconductor layer formed over a portion of the surface of the second insulating layer and between the first region and the second region wherein the second semiconductor layer forms one of a P-gate and an N-gate.

12. The frequency adjustable oscillator according to claim 11, wherein the at least one variable capacitor includes:

a) one of an N-well and P-well implant layer formed in the first semiconductor layer;
b) a first region of one of a N+and a P+implant formed in the one of an N-well and P-well implant layer;
c) a second region of one of a N+and a P+implant formed in the one of an N-well and P-well implant layer;
d) a second insulating layer form over a portion of the surface of the one of an N-well and P-well implant layer; and
e) a second semiconductor layer formed over a portion of the surface of the second insulating layer and between the first region and the second region wherein the second semiconductor layer forms one of a P-gate and an N-gate.

13. The frequency adjustable oscillator according to claim 12, wherein the at least one inductor includes:

a) a second insulating layer contacting the first insulating layer at an interface; and
b) an inductor fabricated above the second dielectric layer.

14. The frequency adjustable oscillator according to claim 13, wherein the substrate is a high resistivity substrate.

15. The frequency adjustable oscillator according to claim 14, wherein the resistivity of the substrate is about 1 kohm-cm.

16. The frequency adjustable oscillator according to claim 15, wherein the at least one inductor further includes a plurality of conducting regions located within the second insulating layer wherein the plurality of conducting regions induce small eddy currents that do not significantly reduce the inductance of the inductor.

17. An integrated circuit, wherein the integrated circuit is coupled to a plurality of N digital control signals and at least one analog control signal, and wherein the plurality of N digital control signals are used to coarsely tune a frequency adjustable oscillator on the integrated circuit, and wherein the at least one analog control signal is used to fine tune the oscillator, the integrated circuit including:

a) at least one inductor;
b) N multiple capacitance level capacitors coupled together in a parallel configuration each multiple capacitance level capacitor having a plurality of steady-state capacitance levels, wherein the N multiple capacitance level capacitors are also coupled in parallel with the at least one inductor, and wherein the multiple capacitance level capacitors are coupled to respective and corresponding N digital control signals, in a one to one relationship; and c) at least one variable capacitance level capacitor coupled in parallel with the N multiple capacitance level capacitors, the capacitance level of the at least one variable capacitor being responsive to at least one analog control signal.

18. The integrated circuit according to claim 17, wherein the oscillator has at least $2^N$ different coarse frequency values due the capacitance across the N multiple capacitance level capacitors as determined by the value of the N control signals.

19. The integrated circuit according to claim 18, wherein each multiple capacitance level capacitor is coupled to one of the N digital control signals and the capacitance level across each multiple capacitance level capacitor varies as a function of the level of the control signal between a first steady state level and a second steady state level changing the coarse oscillation frequency of the oscillator.

20. The integrated circuit according to claim 19, wherein the N digital control signals each have a first and second predetermined value and wherein each multiple capacitance level capacitor has the first steady state level of capacitance when the corresponding digital control signal is less than or equal to the first predetermined value and has the second steady state level of capacitance when the corresponding digital control signal is greater than or equal to the second predetermined value.

21. The integrated circuit according to claim 20, wherein the difference between the first steady-state capacitance level and the second steady-state capacitance level for each multiple capacitance level capacitor is the differential capacitance of the capacitor and wherein each of the N multiple capacitance level capacitors has a different differential capacitance.

22. The integrated circuit according to claim 21, wherein the multiple capacitance level capacitor having the next to lowest differential capacitance includes two multiple capacitance level capacitors in parallel wherein each of the two capacitors in parallel has the lowest differential capacitance.

23. The integrated circuit according to claim 21, wherein the ratio of the differential capacitance of the multiple capacitance level capacitor having the Nth lowest differential capacitance to the differential capacitance of the multiple capacitance level capacitor having the (N-1)th lowest differential capacitance is approximately equal to a fixed predetermined number for N equal from 1 to (N-1).

24. The integrated circuit according to claim 21, wherein the ratio of the differential capacitance of the multiple capacitance level capacitor having the Nth lowest differential capacitance to the differential capacitance of the multiple capacitance level capacitor having the (N-1)th lowest differential capacitance is approximately equal to two for N equal from 1 to (N-1).

25. The integrated circuit according to claim 24, further comprising an amplifier coupled in parallel to the N multiple capacitance level capacitors.

26. The integrated circuit according to claim 25, further comprising a current source coupled to the amplifier.

27. The integrated circuit according to claim 26, further including:

a) a division circuit coupled to the oscillator, the division circuit reducing the frequency of the signal generated by the oscillator by a predetermined number, M to generate a signal having a frequency equal to the frequency of the oscillator signal divided by M;

b) a multiplier coupled to the division circuit, the multiplier receiving a reference signal having a reference frequency and multiplying the reference signal by the reduced frequency signal generated by the division circuit; and c) a loop filter coupled to the division circuit and oscillator, the loop filter low pass filtering the signal generated by the multiplier and generating the at least one analog signal from the low passed signal.

28. The integrated circuit according to claim 27, the integrated circuit comprising:

a) a substrate;

b) a first insulating layer formed on the substrate; and c) a first semiconductor layer formed on the insulating layer.

29. The integrated circuit according to claim 28, wherein each multiple capacitance level capacitor includes:

a) one of an N-well and P-well implant layer formed in the first semiconductor layer;

b) a first region of one of a N+ and a P+ implant formed in the one of an N-well and P-well implant layer;

c) a second region of one of a N+ and a P+ implant formed in the one of an N-well and P-well implant layer;

d) a second insulating layer form over a portion of the surface of the one of an N-well and P-well implant layer; and e) a second semiconductor layer formed over a portion of the surface of the second insulating layer and between the first region and the second region wherein the second semiconductor layer forms one of a P-gate and an N-gate.

30. The integrated circuit according to claim 29, wherein the at least one variable capacitor includes:

a) one of an N-well and P-well implant layer formed in the first semiconductor layer;

b) a first region of one of a $N^+$ and a $P^+$ implant formed in the one of an N-well and P-well implant layer;

c) a second region of one of a $N^+$ and a $P^+$ implant formed in the one of an N-well and P-well implant layer;

d) a second insulating layer form over a portion of the surface of the one of an N-well and P-well implant layer; and e) a second semiconductor layer formed over a portion of the surface of the second insulating layer and between the first region and the second region wherein the second semiconductor layer forms one of a P-gate and an N-gate.

31. The integrated circuit according to claim 30, wherein the at least one inductor includes:

a) a second insulating layer contacting the first insulating layer at an interface; and b) an inductor fabricated above the second dielectric layer.

32. The integrated circuit according to claim 31, wherein the substrate is a high resistivity substrate.

33. The integrated circuit according to claim 32, wherein the resistivity of the substrate is about 1 kohm-cm.

34. The integrated circuit according to claim 33, wherein the at least one inductor further includes a plurality of conducting regions located within the second insulating layer wherein the plurality of conducting regions induce small eddy currents that do not significantly reduce the inductance of the inductor.

35. A method of generating a signal having a desired frequency, the method comprising the steps of:
 a) adjusting the value of N digital control signals coupled to a plurality of N multiple capacitance level capacitors, wherein the capacitors are coupled together in a parallel configuration, each multiple capacitance level capacitor having an associated and corresponding plurality of steady-state capacitance levels, to generate a coarse signal having a frequency where the absolute difference in frequency of the coarse signal from a desired frequency is limited to some maximum value; and
 b) adjusting the value of at least one analog control signal coupled to at least one variable capacitance level capacitor, the variable capacitor coupled in parallel to the plurality of N multiple capacitance level capacitors and the capacitance level of the variable capacitor responsive to the at least one analog control signal, so the frequency of the coarse signal is approximately equal to the desired frequency.

36. The method of generating a signal having a desired frequency according to claim 35, step a) including adjusting the value of N digital control signals coupled to the plurality of N multiple capacitance level capacitors when the value of at least one analog control signal coupled to at least one variable capacitor is below a predetermined minimum threshold value.

37. The method of generating a signal having a desired frequency according to claim 36, step a) including adjusting the value of N digital control signals coupled to the plurality of N multiple capacitance level capacitors when the value of at least one analog control signal coupled to at least one variable capacitor is above a predetermined maximum threshold value.

* * * * *